(12) United States Patent
Park

(10) Patent No.: US 10,185,341 B2
(45) Date of Patent: Jan. 22, 2019

(54) SEMICONDUCTOR DEVICES HAVING VOLTAGE GENERATORS USING WEIGHTED COMBINATION OF FEEDBACK VOLTAGES

(71) Applicant: Samsung Electronics Co., Ltd., Suwon-si, Gyeonggi-do (KR)

(72) Inventor: Min-Sang Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 15/411,181

(22) Filed: Jan. 20, 2017

(65) Prior Publication Data

US 2017/0344041 A1     Nov. 30, 2017

(30) Foreign Application Priority Data

May 30, 2016 (KR) .......................... 10-2016-0066360

(51) Int. Cl.
| | |
|---|---|
| G11C 5/14 | (2006.01) |
| G05F 1/575 | (2006.01) |
| G05F 1/59 | (2006.01) |
| G11C 5/02 | (2006.01) |
| H01L 25/065 | (2006.01) |
| H01L 23/00 | (2006.01) |
| H01L 25/18 | (2006.01) |

(52) U.S. Cl.
CPC ................ *G05F 1/575* (2013.01); *G05F 1/59* (2013.01); *G11C 5/025* (2013.01); *G11C 5/147* (2013.01); *H01L 25/0657* (2013.01); *H01L 24/13* (2013.01); *H01L 24/16* (2013.01); *H01L 24/17* (2013.01); *H01L 25/18* (2013.01); *H01L 2224/131* (2013.01); *H01L 2224/16145* (2013.01); *H01L 2224/17181* (2013.01); *H01L 2225/06513* (2013.01); *H01L 2225/06541* (2013.01); *H01L 2924/1434* (2013.01)

(58) Field of Classification Search
CPC ................................ G11C 5/147; G05F 1/575
See application file for complete search history.

(56) References Cited

U.S. PATENT DOCUMENTS

| | | | |
|---|---|---|---|
| 5,430,642 A | 7/1995 | Nakajima et al. | |
| 5,877,615 A * | 3/1999 | Wang ........................ | G05F 3/16 323/313 |
| 5,907,283 A | 5/1999 | Kim | |
| 6,650,008 B2 | 11/2003 | Tsai et al. | |
| 6,900,626 B2 | 5/2005 | Chevallier et al. | |
| 7,339,423 B2 | 3/2008 | Forbes et al. | |
| 7,521,914 B2 | 4/2009 | Dickerson et al. | |
| 2003/0058729 A1 * | 3/2003 | Nagata ................... | G11C 5/025 365/230.03 |
| 2004/0174150 A1 * | 9/2004 | Zhang .................... | G11C 5/147 323/274 |
| 2013/0207634 A1 * | 8/2013 | Kinoshita ................. | G05F 3/02 323/313 |

(Continued)

*Primary Examiner* — Hoai V Ho
*Assistant Examiner* — Jay Radke
(74) *Attorney, Agent, or Firm* — Myers Bigel, P.A.

(57) ABSTRACT

A voltage generator which generates an internal voltage based on a varying voltage derived from the internal voltage includes a feedback control circuit configured to variably transmit the varying voltage responsive to a control signal to generate a feedback voltage. A voltage generation circuit is configured to generate the internal voltage based on the feedback voltage.

18 Claims, 21 Drawing Sheets

(56) References Cited

U.S. PATENT DOCUMENTS

| | | |
|---|---|---|
| 2014/0185344 A1 | 7/2014 | Fornage et al. |
| 2016/0028396 A1* | 1/2016 | Gaillardon ......... H03K 19/0013 326/38 |
| 2016/0081175 A1 | 3/2016 | Kamata |
| 2017/0293445 A1* | 10/2017 | Jain ....................... G06F 3/0625 |

* cited by examiner

SEMICONDUCTOR DEVICES HAVING VOLTAGE GENERATORS USING WEIGHTED COMBINATION OF FEEDBACK VOLTAGES

CROSS-REFERENCE TO RELATED APPLICATION

This application claims the benefit of Korean Patent Application No. 10-2016-0066360, filed on May 30, 2016, in the Korean Intellectual Property Office, the disclosure of which is incorporated herein in its entirety by reference.

BACKGROUND

The inventive concept relates to a semiconductor devices and, more particularly, to semiconductor devices including voltage generators.

Semiconductor devices may generate multiple supply voltages and signal voltages. A semiconductor device may include a voltage generator configured to generate multiple supply voltages, which may be supplied to circuit regions via power lines. As the circuit regions are activated, a supply voltage level may vary. In order to stabilize the supply voltage level, the voltage generator may receive voltage feedback from the circuit regions and responsively adjust the supply voltage level.

SUMMARY

Some embodiments of the inventive concept can provide a voltage generator for generating an optimal internal voltage by using a feedback control circuit. Some embodiments can provide a memory device including a voltage generator.

According to some embodiments of the inventive concept, a voltage generator which generates an internal voltage based on a varying voltage derived from the internal voltage includes a feedback control circuit configured to variably transmit the varying voltage responsive to a control signal to generate a feedback voltage. A voltage generation circuit is configured to generate the internal voltage based on the feedback voltage.

According to further embodiments, a memory device includes a voltage generator configured to generate an internal voltage, a first circuit driven by the voltage generator and configured to vary a first voltage derived from the internal voltage, a second circuit driven by the voltage generator and configured to vary a second voltage derived from the internal voltage. The voltage generator includes a feedback control circuit configured to variably transmit each of the first and second voltages to generate a feedback voltage in response to each of first and second control signals and a voltage generation circuit configured to generate the internal voltage responsive to the feedback voltage.

In still further embodiments, a semiconductor device includes a voltage generator circuit configured to generate an internal voltage. A feedback voltage generator circuit is configured to receive first and second feedback voltages and to variably couple respective first and second nodes having the first and second feedback voltages thereat to at least one voltage feedback node of the voltage generator circuit responsive to first and second control signals. The first and second control signals may be variable voltage signals or multi-bit digital signals.

In some embodiments, the feedback voltage generator circuit may include respective first and second transmission gates configured to couple the first and second nodes to the at least one voltage feedback node responsive to the first and second control signals. In some embodiments, the voltage generator circuit may be configured to compare a voltage at the feedback node to a reference voltage to generate the internal voltage. In some embodiments, the voltage generator circuit may include first and second voltage generator circuits having outputs coupled to one another and configured to compare respective ones of the first and second feedback voltages to a voltage reference signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

As used herein, the term "and/or" includes any and all combinations of one or more of the associated listed items. Expressions such as "at least one of" when preceding a list of elements, modify the entire list of elements and do not modify the individual elements of the list.

The foregoing description of the inventive concept is for illustrative purposes, those with ordinary skill in the technical field of the inventive concept pertains in other specific forms without changing the technical idea or essential features of the inventive concept that may be modified to be able to understand. Therefore, the embodiments described above, exemplary in all respects and must understand that it is not limited.

Figure 1:
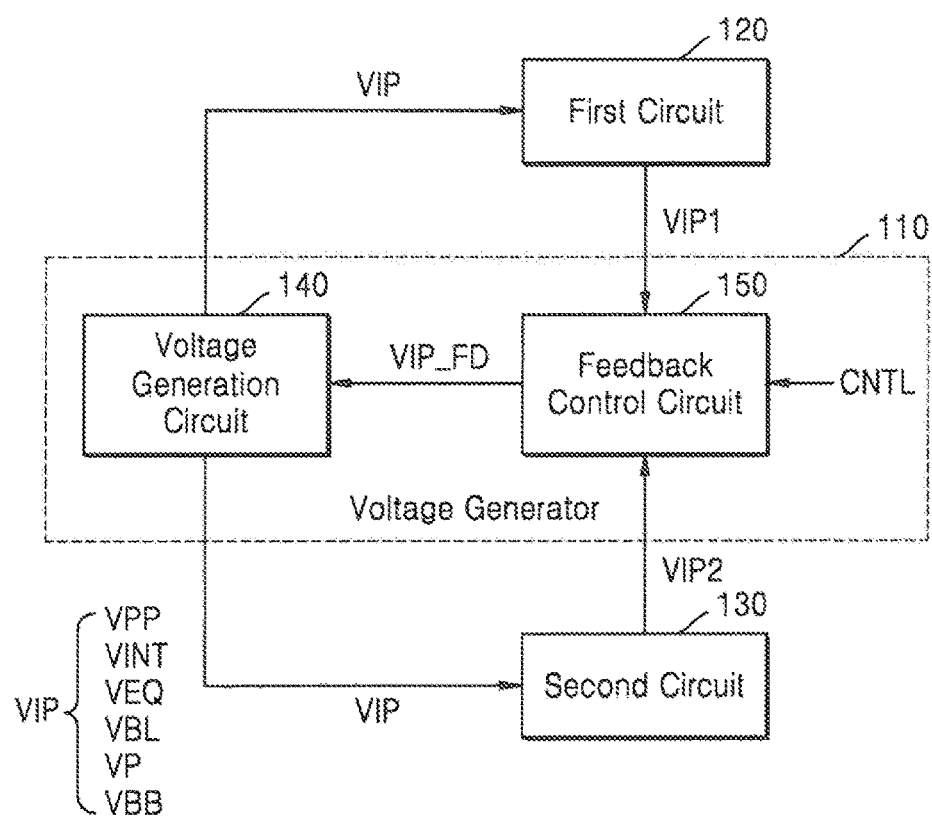
FIG. 1 is a block diagram illustrating a voltage generator including a feedback control circuit according to some embodiments.

FIG. 1 is a block diagram illustrating a voltage generator 110 including a feedback control circuit according to some embodiments.

Referring to FIG. 1, the voltage generator 110 may include a voltage generation circuit 140 and a feedback control circuit 150. The voltage generation circuit 140 may generate an internal voltage VIP and may supply the internal voltage VIP to a first circuit 120 and a second circuit 130.

The first circuit 120 and the second circuit 130 may be circuit blocks which are driven with the internal voltage VIP. For example, each of the first circuits 120 and 130 may be ones of a plurality of core blocks connected to a plurality of memory cell blocks included in a memory device. The first circuit 120 may correspond to a first core block connected to a first memory cell block, and the second circuit 130 may correspond to a second core block connected to a second memory cell block. In the present embodiments, the voltage generator 110 is described as fundamentally including the first and second circuits 120 and 130, but the scope of the inventive concept is not limited thereto. In other embodiments, the voltage generator 110 may include two or more circuits.

The first circuit 120 and the second circuit 130 may perform the same function at the same time. For example, the first circuit 120 and the second circuit 130 may identically perform write operations, read operations, or refresh operations. In some embodiments, the first circuit 120 and the second circuit 130 may perform different functions at the same time. For example, the first circuit 120 may perform a refresh operation, and the second circuit 130 may perform a write operation.

The voltage generator 110 may be built into a memory device, such as a dynamic random access memory (DRAM) or the like. Therefore, the internal voltage VIP generated by the voltage generation circuit 140 may be, for example, at least one of a high voltage VPP for driving a word line, an internal supply voltage VINT, a bit line equalizing voltage VEQ, a cell plate voltage VP for a memory cell capacitor and a bit line pre-charge voltage VBL which each are a half level voltage of the internal supply voltage VINT, and a substrate supply voltage VBB.

The first circuit 120 may be driven with the internal voltage VIP supplied from the voltage generation circuit 140, and the internal voltage VIP may be varied responsive to operation of the first circuit 120. For example, in a case where the first circuit 120 is a first core block that performs a refresh operation after a pre-charge operation and an active operation of the first core block. In this case, a level of the high voltage VPP, which is a word line driving voltage, may drop. In restoring cell data, a level of the internal supply voltage VINT, which is a cell array voltage, may drop. An internal voltage varied in the first circuit 120 may be referred to as a first internal voltage VIP1.

The second circuit 130 may be driven with the internal voltage VIP supplied from the voltage generation circuit 140. The internal voltage VIP may vary responsive to operation of the second circuit 130. For example, the second circuit 130 is a second core block that performs a read operation or a write operation, or may be in a standby mode. When the second circuit 130 is in the standby mode, current consumption by the second circuit 130 may be low, and thus, a variation of the internal voltage VIP may be small. An internal voltage varied in the second circuit 130 may be referred to as a second internal voltage VIP2.

If the internal voltage VIP supplied to the first circuit 120 and the second circuit 130 is the internal supply voltage VINT, the first circuit 120 performs the refresh operation, and the second circuit 130 is in the standby mode, a variation of the first internal voltage VIP1 may be relatively large in responsive to the refresh operation of the first circuit 120. A variation of the second internal voltage VIP2 of the second circuit 130 which is in the standby mode may be relatively smaller than that of the first internal voltage VIP1. The internal voltage VIP generated by the voltage generation circuit 140 in response to the first internal voltage VIP1 which exhibits a greater variation, so that the first internal voltage VIP1 which has a greater variation than the second internal voltage VIP2.

The first internal voltage VIP1 and the second internal voltage VIP2 may be supplied to the feedback control circuit 150. The feedback control circuit 150 may variably transmit the first internal voltage VIP1 and to the second internal voltage VIP2 to output a feedback internal voltage VIP_FD in response to first and second control signals CNTL1 and CNTL2. The feedback control circuit 150 may weight contributions of the first internal voltage VIP1 and the second internal voltage VIP2 in generating the feedback internal voltage VIP_FD.

The first and second control signals CNTL1 and CNTL2 may be supplied based on information (e.g., operation-based options) stored in an internal mode register. For example, the first and second control signals CNTL1 and CNTL2 may be supplied at a first voltage level for an active operation mode and at a second voltage level lower than the first voltage level for a standby operation mode. The active operation mode may include a read operation, a write operation, and a refresh operation.

The first and second control signals CNTL1 and CNTL2 may each include a plurality of bits. In the first and second control signals CNTL1 and CNTL2, for example, the number of logic "1" bits may be differently provided according to an operation mode. In the first and second control signals CNTL1 and CNTL2, the number of logic "1" bits corresponding to the active operation mode may be set larger than the number of bits corresponding to the standby mode.

The first and second control signals CNTL1 and CNTL2 may vary a transmission of each of the first internal voltage VIP1 and the second internal voltage VIP2, based on a voltage level of a corresponding voltage or digital value. For example, the first control signal CNTL1 having a first voltage level or digital value may cause a relatively high contribution of the first internal voltage VIP1, and the second control signal CNTL2 having a second voltage level or digital value may cause a relatively low contribution of the second internal voltage VIP2.

Therefore, the voltage generator 110 may variably transmit the first and second internal voltages VIP1 and VIP2, which have varied through the feedback control circuit 150, to sufficiently reflect the varied first and second internal voltages VIP1 and VIP2, thereby stably generating an internal voltage.

Figure 2:
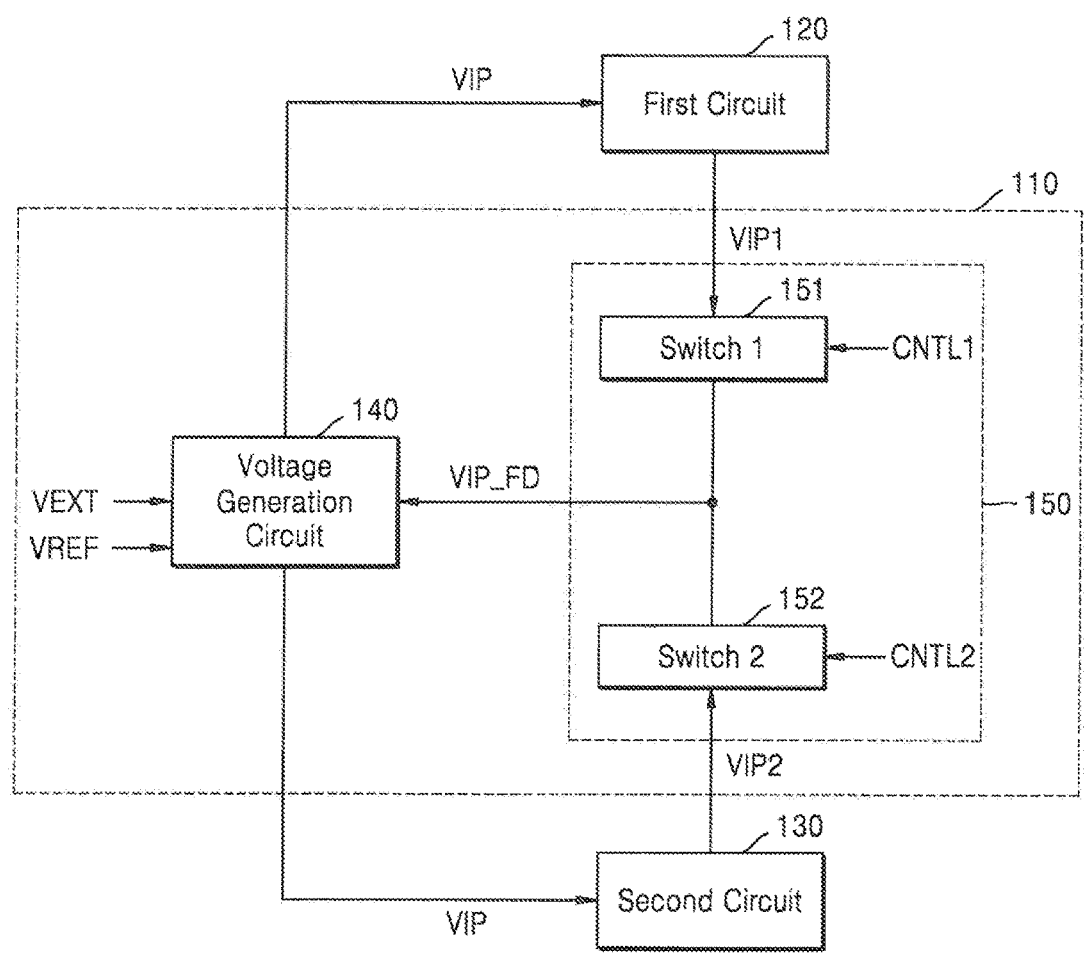
FIG. 2 is a diagram illustrating the feedback control circuit of FIG. 1.

FIG. 2 is a diagram illustrating the feedback control circuit 150 of FIG. 1.

Referring to FIG. 2, the feedback control circuit 150 may include a first switch 151, which transmits the first internal voltage VIP1 of the first circuit 120 as the feedback internal voltage VIP_FD, and a second switch 152 which transmits the second internal voltage VIP2 of the second circuit 130 as the feedback internal voltage VIP_FD.

The first switch 151 may transmit the first internal voltage VIP1 as the feedback internal voltage VIP_FD in response to the first control signal CNTL1. For example, when the first circuit 120 is in an active mode, the first control signal CNTL1 may be supplied at the first voltage level, a transmission of the first internal voltage VIP1 may increase, and the feedback internal voltage VIP_FD may include a relatively high weighting of the first internal voltage VIP1. Alternatively, when the first circuit 120 is in the standby mode, the first control signal CNTL1 may be supplied at the second voltage level, a transmission of the first internal voltage VIP1 may be lowered, and the feedback internal voltage VIP_FD may include a relatively low weighting of the first internal voltage VIP1.

The second switch 151 may transmit the second internal voltage VIP2 to the feedback internal voltage VIP_FD node in response to the second control signal CNTL2. For example, when the second circuit 130 is in the active mode, the second control signal CNTL2 may be supplied at the second voltage level, a transmission of the second internal voltage VIP2 may increase, and the feedback internal voltage VIP_FD may include a relatively high weighting of the second internal voltage VIP2. Alternatively, when the second circuit 130 is in the standby mode, the second control signal CNTL2 may be supplied at the second voltage level, a transmission of the second internal voltage VIP2 may be lowered, and the feedback internal voltage VIP_FD may include a relatively low weighting of the second internal voltage VIP2.

The feedback internal voltage VIP_FD of the feedback control circuit 150 may be supplied to the voltage generation circuit 140. The voltage generation circuit 140 may be driven by an external supply voltage VEXT, may compare the supplied feedback internal voltage VIP_FD with a reference voltage VREF, and may generate the internal voltage VIP in order for the feedback internal voltage VIP_FD to become equal to the reference voltage VREF.

Figure 3:
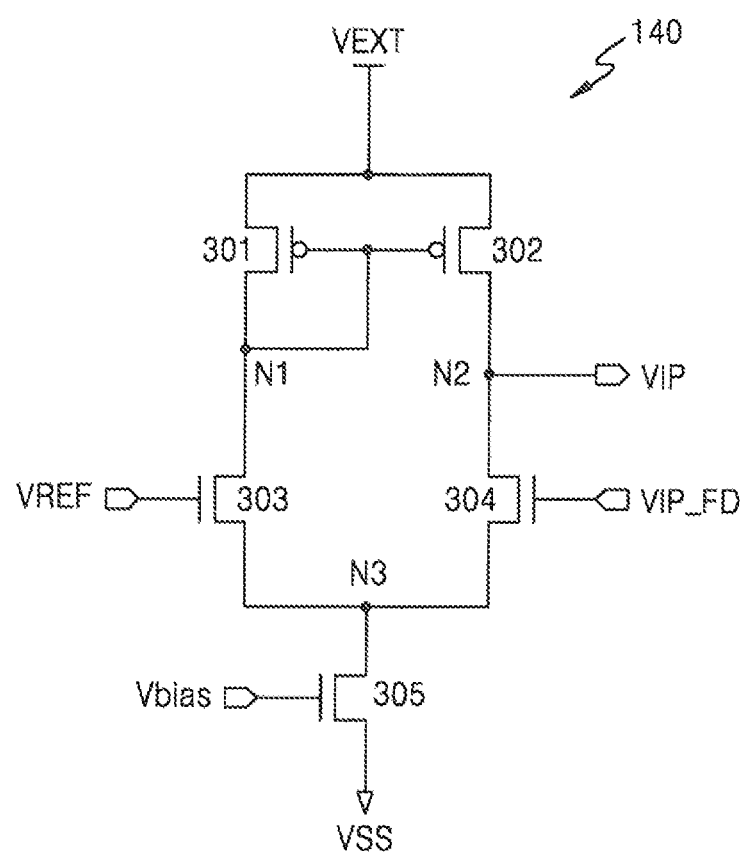
FIG. 3 is a circuit diagram illustrating a voltage generation circuit of FIG. 2.

FIG. 3 is a circuit diagram illustrating the voltage generation circuit 140 of FIG. 2.

Referring to FIG. 3, the voltage generation circuit 140 may compare the reference voltage VREF with the feedback internal voltage VIP_FD to generate the internal voltage VIP. The reference voltage VREF may act as a target voltage of the generated internal voltage VIP. The reference voltage VREF may be supplied at a voltage level of at least one of the high voltage VPP, the internal supply voltage VINT, the bit line equalizing voltage VEQ, the bit line pre-charge voltage VBL, the cell plate voltage VP, and the substrate supply voltage VBB.

The voltage generation circuit 140 may include a first PMOS transistor 301 connected between the external supply voltage VEXT and a first node N1, a second PMOS transistor 302 connected between the external supply voltage VEXT and a second node N2, a first NMOS transistor 303 connected between the first node N1 and a third node N3, a second NMOS transistor 304 connected between the second node N2 and the third node N3, and a third NMOS transistor 305 connected between the third node N3 and a ground voltage VSS. A voltage of the second node N2 may be output as the internal voltage VIP.

Gates of the first and second PMOS transistors 301 and 302 may be connected to the first node N1, and the first and second PMOS transistors 301 and 302 may configure a current mirror. A gate of the first NMOS transistor 303 may be connected to the reference voltage VREF, and a gate of the second NMOS transistor 304 may be connected to the feedback internal voltage VIP_FD. A gate of the third NMOS transistor 305 may be connected to a bias voltage Vbias. The bias voltage Vbias may enable the voltage generation circuit 140.

The voltage generation circuit 140 may generate the internal voltage VIP which is to be become equal to the reference voltage VREF. If a level of the feedback internal voltage VIP_FD is lower than that of the reference voltage VREF, the voltage generation circuit 140 may output the internal voltage VIP in order for a level of the internal voltage VIP to become equal to a level of the reference voltage VREF. If a level of the feedback internal voltage VIP_FD is higher than that of the reference voltage VREF, the voltage generation circuit 140 may output the internal voltage VIP in order for a level of the internal voltage VIP to become equal to a level of the reference voltage VREF. Accordingly, the voltage generation circuit 140 may receive the feedback internal voltage VIP_FD to stably generate the internal voltage VIP at a target voltage level.

FIGS. 4 to 10 are circuit diagrams illustrating the first and second switches of FIG. 2. The first and second switches illustrated in FIGS. 4A and 5 to 10 may apply the variable transmission to the first and second internal voltages VIP1 and VIP2 according to voltage levels of the first and second control signals CNTL1 and CNTL2 to output the feedback internal voltage VIP_FD. The first and second switches of FIG. 4B may apply the variable transmission to the first and second internal voltages VIP1 and VIP2 according to logic values of bits constituting the first and second control signals CNTL1 and CNTL2 to output the feedback internal voltage VIP_FD.

Figure 4A:
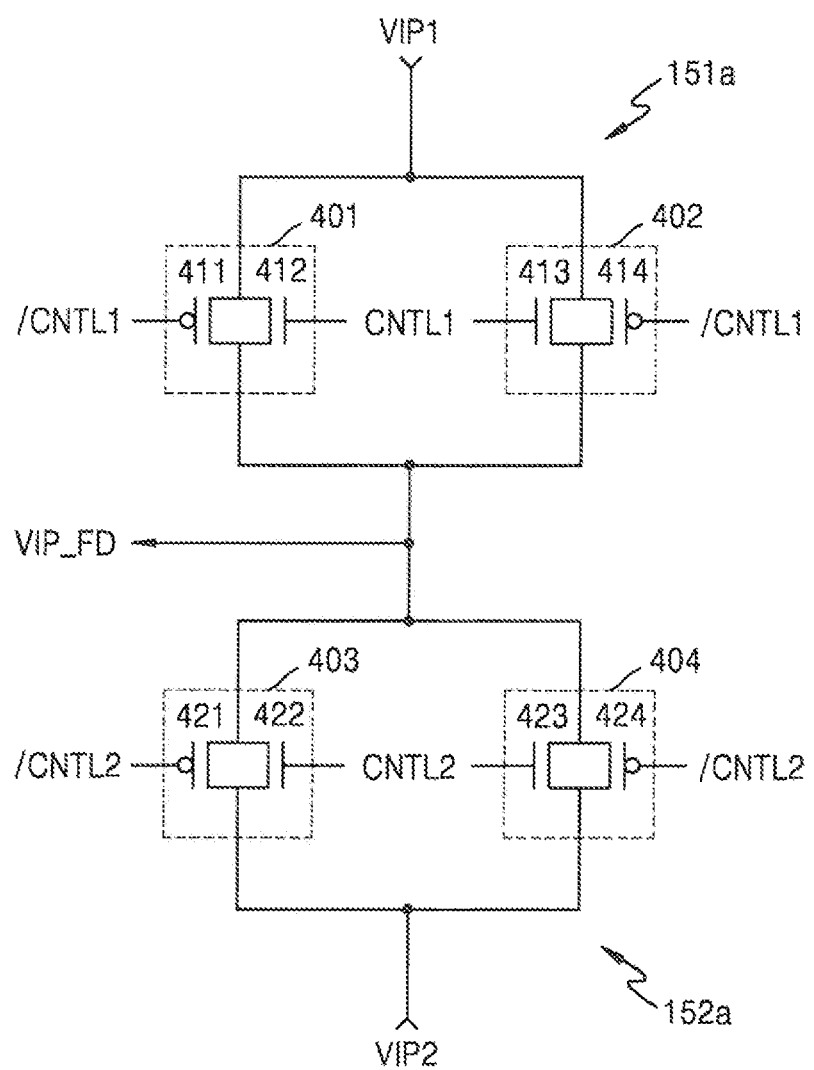
FIGS. 4A, 4B, and 5 to 10 are circuit diagrams illustrating first and second switches of FIG. 2.

Referring to FIG. 4A, a first switch 151a may include a first PMOS transistor 411, a first NMOS transistor 412, a second NMOS transistor 413, and a second PMOS transistor 414 which are connected between the first internal voltage VIP1 and the feedback internal voltage VIP_FD. A first complementary control signal /CNTL1 may be connected to gates of the first and second PMOS transistors 411 and 414, and the first control signal CNTL1 may be connected to gates of the first and second NMOS transistors 412 and 413. The first PMOS transistor 411 and the first NMOS transistor 412 may configure a first transmission gate 401, and the second NMOS transistor 413 and the second PMOS transistor 414 may configure a second transmission gate 402. The first complementary control signal /CNTL1 may have a logic level which is opposite to a logic level of the first control signal CNTL1.

A second switch 152a may include a third PMOS transistor 421, a third NMOS transistor 422, a fourth NMOS transistor 423, and a fourth PMOS transistor 424 which are connected between the second internal voltage VIP2 and the feedback internal voltage VIP_FD. A second complementary control signal /CNTL2 may be connected to gates of the third and fourth PMOS transistors 421 and 424, and the second control signal CNTL2 may be connected to gates of the third and fourth NMOS transistors 422 and 423. The third PMOS transistor 421 and the third NMOS transistor 422 may configure a third transmission gate 403, and the fourth NMOS transistor 423 and the fourth PMOS transistor 424 may configure a fourth transmission gate 404. The second complementary control signal /CNTL2 may have a logic level which is opposite to a logic level of the second control signal CNTL2.

In FIG. 4A, the first switch 151a may vary a degree, to which each of the first and second transmission gates 401 and 402 is turned on, according to a voltage level of the first control signal CNTL1 to vary a transmission of the first internal voltage VIP1 to the feedback internal voltage VIP_FD node. The second switch 152a may vary a degree, to which each of the third and fourth transmission gates 403 and 404 is turned on, according to a voltage level of the second control signal CNTL2 to vary a transmission of the second internal voltage VIP2 to the feedback internal voltage VIP_FD node. The feedback internal voltage VIP_FD may be supplied to the voltage generation circuit 140 of the voltage generator 110 (see FIG. 2).

Figure 4B:
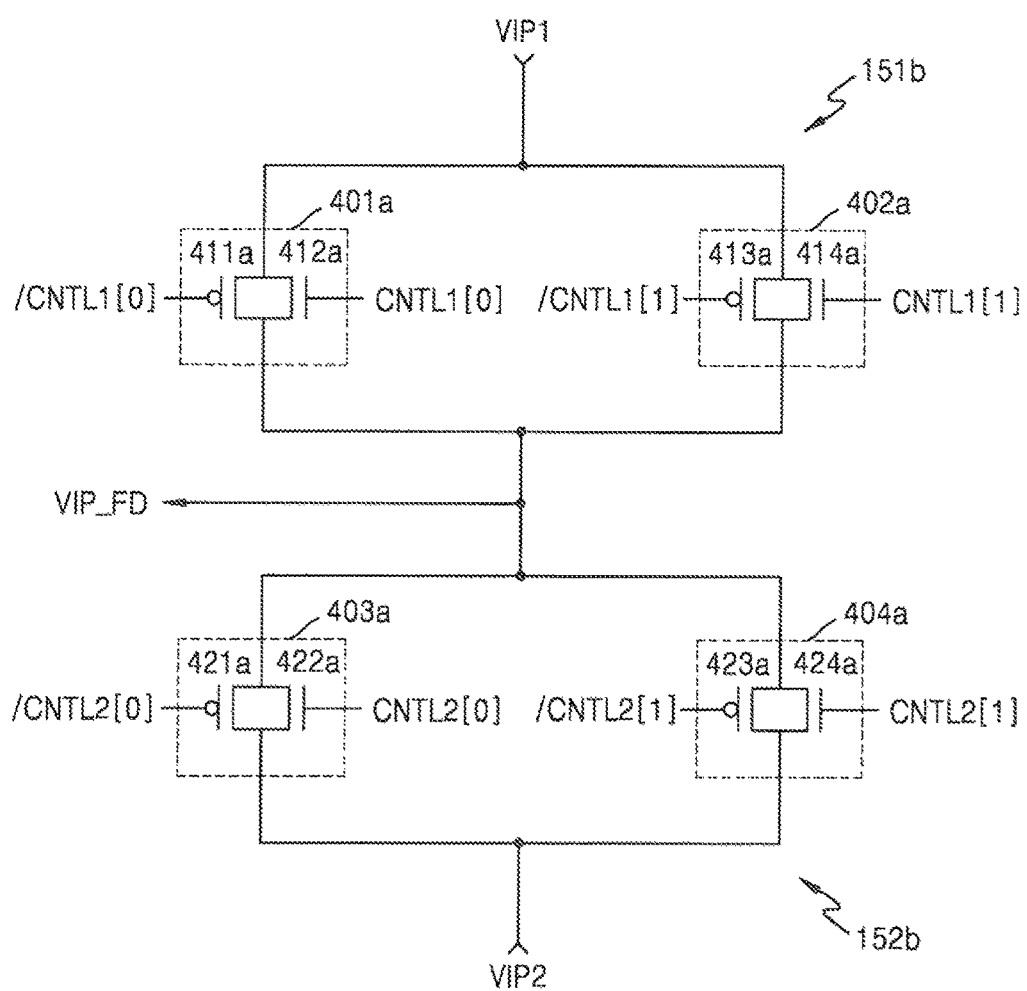

Referring to FIG. 4B, a first switch 151b may include a first PMOS transistor 411a, a first NMOS transistor 412a, a second NMOS transistor 413a, and a second PMOS transistor 414a which are connected between the first internal voltage VIP1 and the feedback internal voltage VIP_FD. A first bit /CNTL1[0] of a first complementary control signal may be applied to a gate of the first PMOS transistor 411a, and a second bit /CNTL1[1] of the first complementary control signal may be applied to a gate of the second PMOS transistor 414a. A first bit CNTL1[0] of a first control signal may be applied to a gate of the first NMOS transistor 412a, and a second bit CNTL1[1] of the first control signal may be applied to a gate of the second NMOS transistor 413a. The first PMOS transistor 411a and the first NMOS transistor 412a may form a first transmission gate 401a, and the second NMOS transistor 413a and the second PMOS transistor 414a may form a second transmission gate 402a.

A second switch 152b may include a third PMOS transistor 421a, a third NMOS transistor 422a, a fourth NMOS transistor 423a, and a fourth PMOS transistor 424a which are connected between the second internal voltage VIP2 and the feedback internal voltage VIP_FD. A first bit /CNTL2[0] of a second complementary control signal may be applied to gates of the third PMOS transistor 421a, and a second bit /CNTL2[1] of the second complementary control signal may be applied to a gate of the fourth PMOS transistor 424a. A first bit CNTL2[0] of a second control signal may be applied to a gate of the third NMOS transistor 422a, and a second bit CNTL2[1] of the second control signal may be applied to a gate of the second NMOS transistor 423a. The third PMOS transistor 421a and the third NMOS transistor 422a may form a third transmission gate 403a, and the fourth NMOS transistor 423a and the fourth PMOS transistor 424a may form a fourth transmission gate 404a.

In FIG. 4B, the first switch 151b may vary the number of turned-on transistors according to logic values of bits of a first control signal CNTL1[1:0] to vary a transmission of the first internal voltage VIP1 to the feedback internal voltage VIP_FD node. The second switch 152b may vary the number of turned-on transistors according to logic values of bits of a second control signal CNTL2[1:0] to vary a transmission of the second internal voltage VIP2 to the feedback internal voltage VIP_FD node. The feedback internal voltage VIP_FD may be supplied to the voltage generation circuit 140 of the voltage generator 110 (see FIG. 2).

In some embodiments, the first and second switches 151b and 152b may each include characteristics (for example, resistance, inductance, capacitance and the like) obtained by modeling a line network on a path, through which the first and second internal voltages VIP1 and VIP2 are transmitted, which will be described below with reference to FIGS. 5 to 10.

In the embodiments of FIGS. 4A and 4B, the first and second switches 151a, 152a, 151b and 152b have been described above as including four transmission gates, but the scope of the inventive concept is not limited thereto. In other embodiments, the first and second switches 151a, 152a, 151b and 152b may include a various number of transmission gates.

Figure 5:
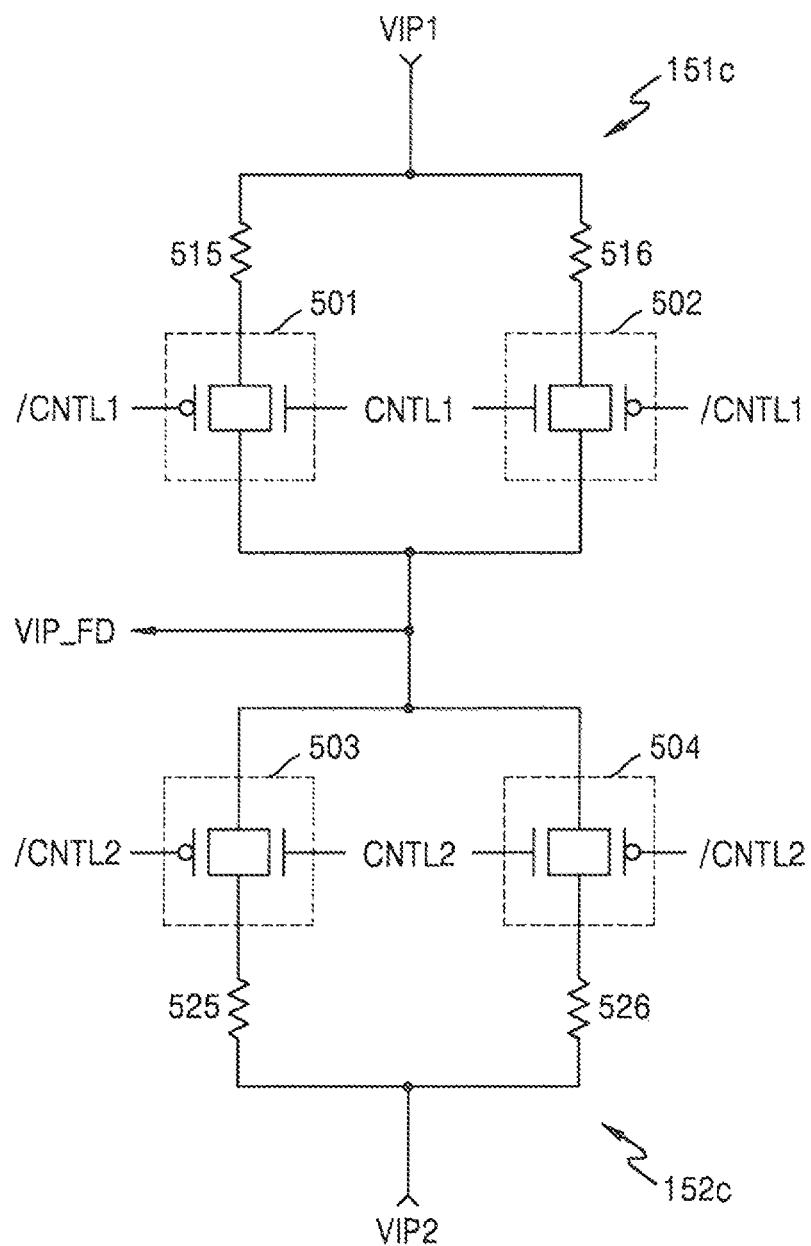

Referring to FIG. 5, in comparison with the first switch 151a of FIG. 4A, a first switch 151c may further include a first resistor 515, connected between the first internal voltage VIP1 and a first transmission gate 501, and a second resistor 516 connected between the first internal voltage VIP1 and a second transmission gate 502. In comparison with the second switch 152a of FIG. 4A, a second switch 152c may further include a third resistor 525, connected between the second internal voltage VIP2 and a third transmission gate 503, and a fourth resistor 526 connected between the second internal voltage VIP2 and a fourth transmission gate 504.

The first and second resistors 515 and 516 may be provided by modeling a line network on a path through which the first internal voltage VIP1 is transmitted in a first circuit (120 of FIG. 2). The third and fourth resistors 525 and 526 may be provided by modeling a line network on a path through which the second internal voltage VIP2 is transmitted in a second circuit (130 of FIG. 2).

In FIG. 5, the first switch 151c may vary transmission of the first internal voltage VIP1 of the first internal voltage VIP1 to the feedback internal voltage VIP_FD node according to a voltage level of the first control signal CNTL1 and resistance values of the first and second resistors 515 and 516. The second switch 152c may vary a transmission of the second internal voltage VIP2 to the feedback internal voltage VIP_FD node according to a voltage level of the second control signal CNTL2 and resistance values of the third and fourth resistors 525 and 526. The feedback internal voltage VIP_FD may be supplied to the voltage generation circuit 140 of the voltage generator 110 (see FIG. 2).

Figure 6:
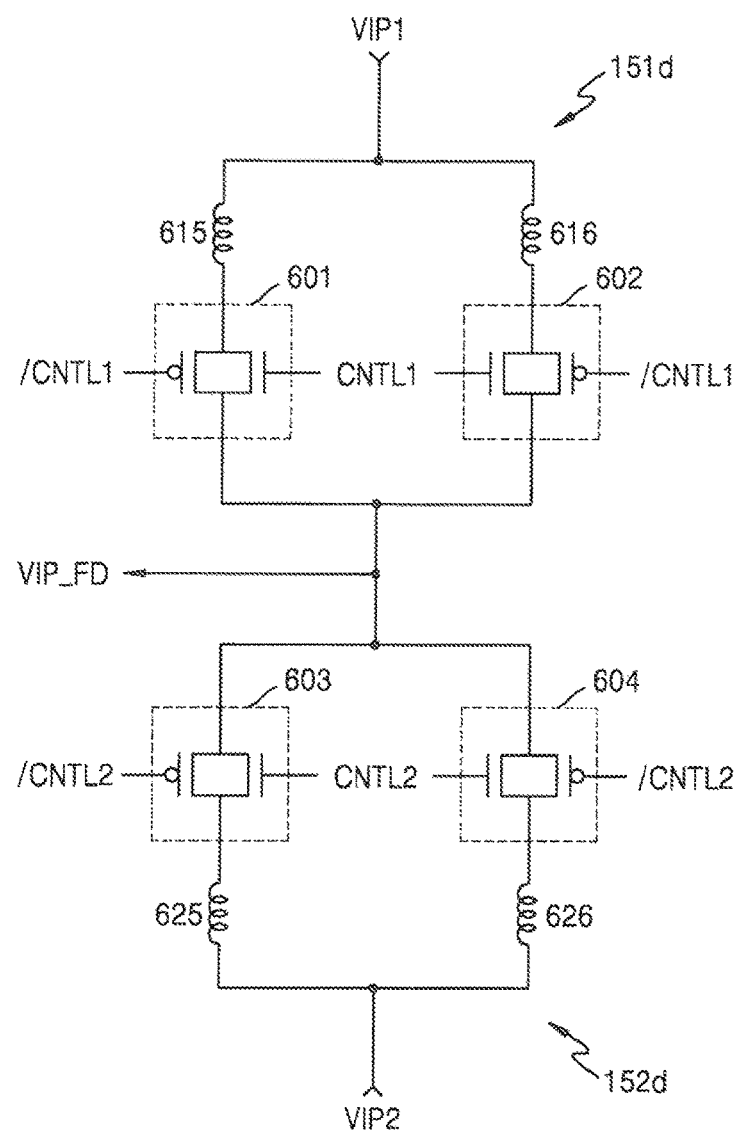

Referring to FIG. 6, in comparison with the first switch 151c of FIG. 5, a first switch 151d has a difference in that the first switch 151d includes a first inductor 615 instead of the first resistor 515 and includes a second inductor 616 instead of the second resistor 516. In comparison with the second switch 152c of FIG. 5, a second switch 152d has a difference in that the second switch 152d includes a third inductor 625 instead of the third resistor 525 and includes a fourth inductor 626 instead of the fourth resistor 526.

The first and second inductors 615 and 616 may be provided by modeling a line network on a path through which the first internal voltage VIP1 is transmitted in a first circuit (120 of FIG. 2). The third and fourth inductors 625 and 626 may be provided by modeling a line network on a path through which the second internal voltage VIP2 is transmitted in a second circuit (130 of FIG. 2).

In FIG. 6, the first switch 151d may vary a transmission of the first internal voltage VIP1 to the feedback internal voltage VIP_FD node according to a voltage level of the first control signal CNTL1 and inductance values of the first and second inductors 615 and 616. The second switch 152d may vary a transmission of the second internal voltage VIP2 to the feedback internal voltage VIP_FD node according to a voltage level of the second control signal CNTL2 and inductance values of the third and fourth inductors 625 and 626. The feedback internal voltage VIP_FD may be supplied to the voltage generation circuit 140 of the voltage generator 110 (see FIG. 2).

Figure 7:
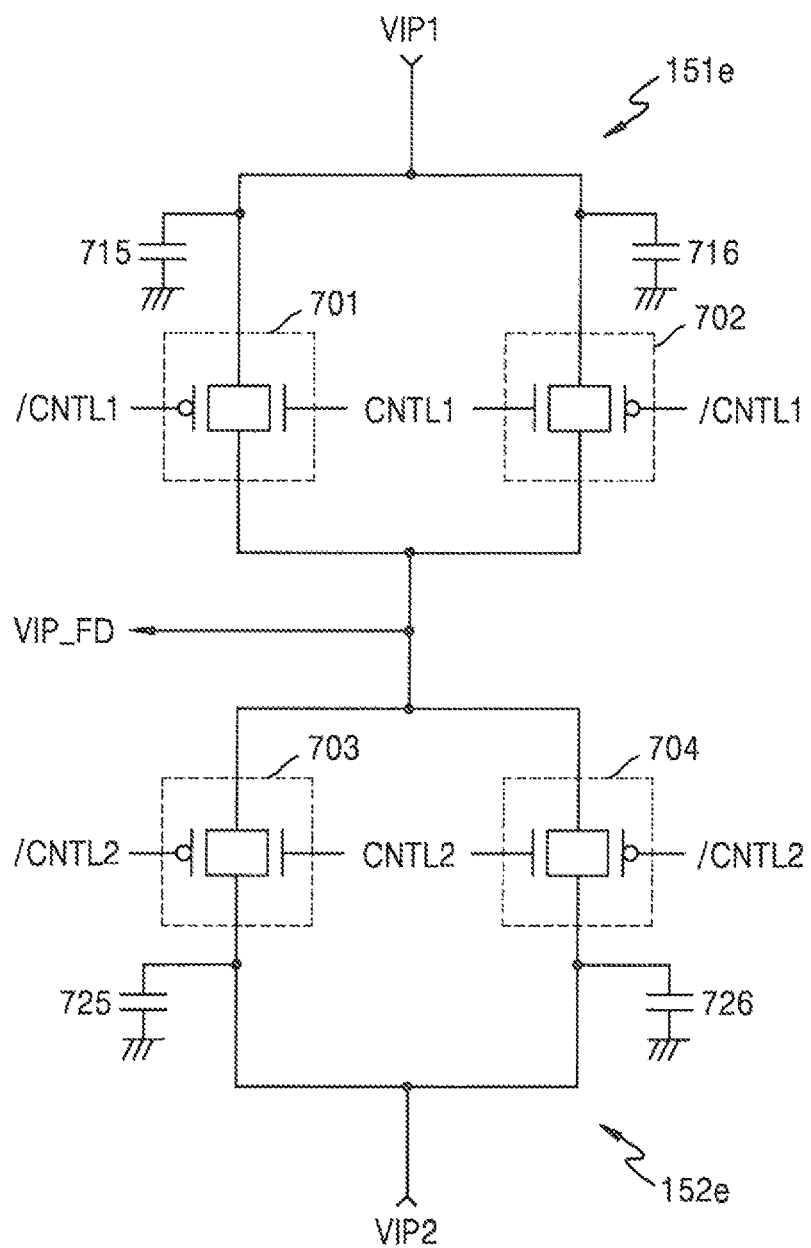

Referring to FIG. 7, in comparison with the first switch 151a of FIG. 4A, a first switch 151e may further include a first capacitor 715, connected between a ground voltage VSS and a connection node between the first internal voltage VIP1 and a first transmission gate 701, and a second capacitor 716 connected between the ground voltage VSS and a connection node between the first internal voltage VIP1 and a second transmission gate 702. In comparison with the second switch 152a of FIG. 4A, a second switch 152e may further include a third capacitor 725, connected between the ground voltage VSS and a connection node between the second internal voltage VIP2 and a third transmission gate 703, and a fourth capacitor 726 connected between the ground voltage VSS and a connection node between the second internal voltage VIP2 and a fourth transmission gate 704.

The first and second capacitors 715 and 716 may be provided by modeling a line network on a path through which the first internal voltage VIP1 is transmitted in a first circuit (120 of FIG. 2). The third and fourth capacitors 725 and 726 may be provided by modeling a line network on a path through which the second internal voltage VIP2 is transmitted in a second circuit (130 of FIG. 2).

In FIG. 7, the first switch 151e may vary a transmission of the first internal voltage VIP1 to the feedback internal voltage VIP_FD node according to a voltage level of the first control signal CNTL1 and capacitance values of the first and second capacitors 715 and 716. The second switch 152e may vary a transmission of the second internal voltage VIP2 to the feedback internal voltage VIP_FD node according to a voltage level of the second control signal CNTL2 and capacitance values of the third and fourth capacitors 725 and 726. The feedback internal voltage VIP_FD may be supplied to the voltage generation circuit 140 of the voltage generator 110 (see FIG. 2).

Figure 8:
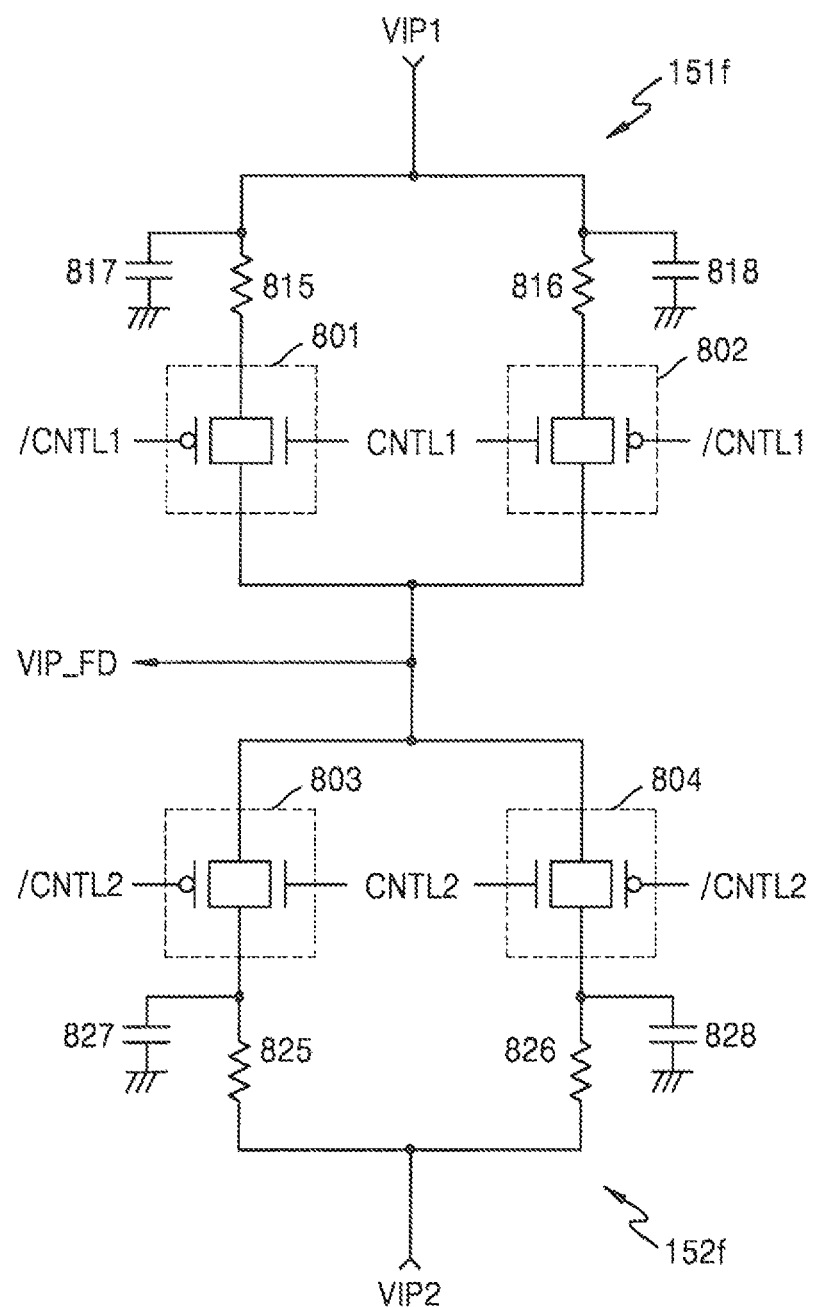

Referring to FIG. 8, a first switch 151f may include a first resistor 815 connected to the first internal voltage VIP1 at a first end of the first resistor 815, a second resistor 816 connected to the first internal voltage VIP1 at a first end of the second resistor 816, a first capacitor 817 connected between the first end of the first resistor 815 and the ground voltage VSS, a second capacitor 818 connected between the first end of the second resistor 816 and the ground voltage VSS, a first transmission gate 801 connected between a second end of the first resistor 815 and the feedback internal voltage VIP_FD, and a second transmission gate 802 connected between a second end of the second resistor 816 and the feedback internal voltage VIP_FD. A second switch 152f may include a third resistor 825 connected to the second internal voltage VIP2 at a first end of the third resistor 825, a fourth resistor 826 connected to the second internal voltage VIP2 at a first end of the fourth resistor 826, a third capacitor 827 connected between the first end of the third resistor 825 and the ground voltage VSS, a fourth capacitor 828 connected between the first end of the fourth resistor 826 and the ground voltage VSS, a third transmission gate 803 connected between a second end of the third resistor 825 and the feedback internal voltage VIP_FD, and a fourth transmission gate 804 connected between a second end of the fourth resistor 826 and the feedback internal voltage VIP_FD.

The first and second resistors 815 and 816 and the first and second capacitors 817 and 818 may be provided by modeling a line network on a path through which the first internal voltage VIP1 is transmitted in a first circuit (120 of FIG. 2). The third and fourth resistors 825 and 826 and the third and fourth capacitors 827 and 828 may be provided by modeling a line network on a path through which the second internal voltage VIP2 is transmitted in a second circuit (130 of FIG. 2).

In FIG. 8, the first switch 151f may vary a transmission of the first internal voltage VIP1 to the feedback internal voltage VIP_FD node according to a voltage level of the first control signal CNTL1, resistance values of the first and second resistors 815 and 816, and capacitance values of the first and second capacitors 817 and 818. The second switch 152f may vary a transmission of the second internal voltage VIP2 to the feedback internal voltage VIP_FD node according to a voltage level of the second control signal CNTL2, resistance values of the third and fourth resistors 825 and 826, and capacitance values of the third and fourth capacitors 827 and 828. The feedback internal voltage VIP_FD may be supplied to the voltage generation circuit 140 of the voltage generator 110 (see FIG. 2).

Figure 9:
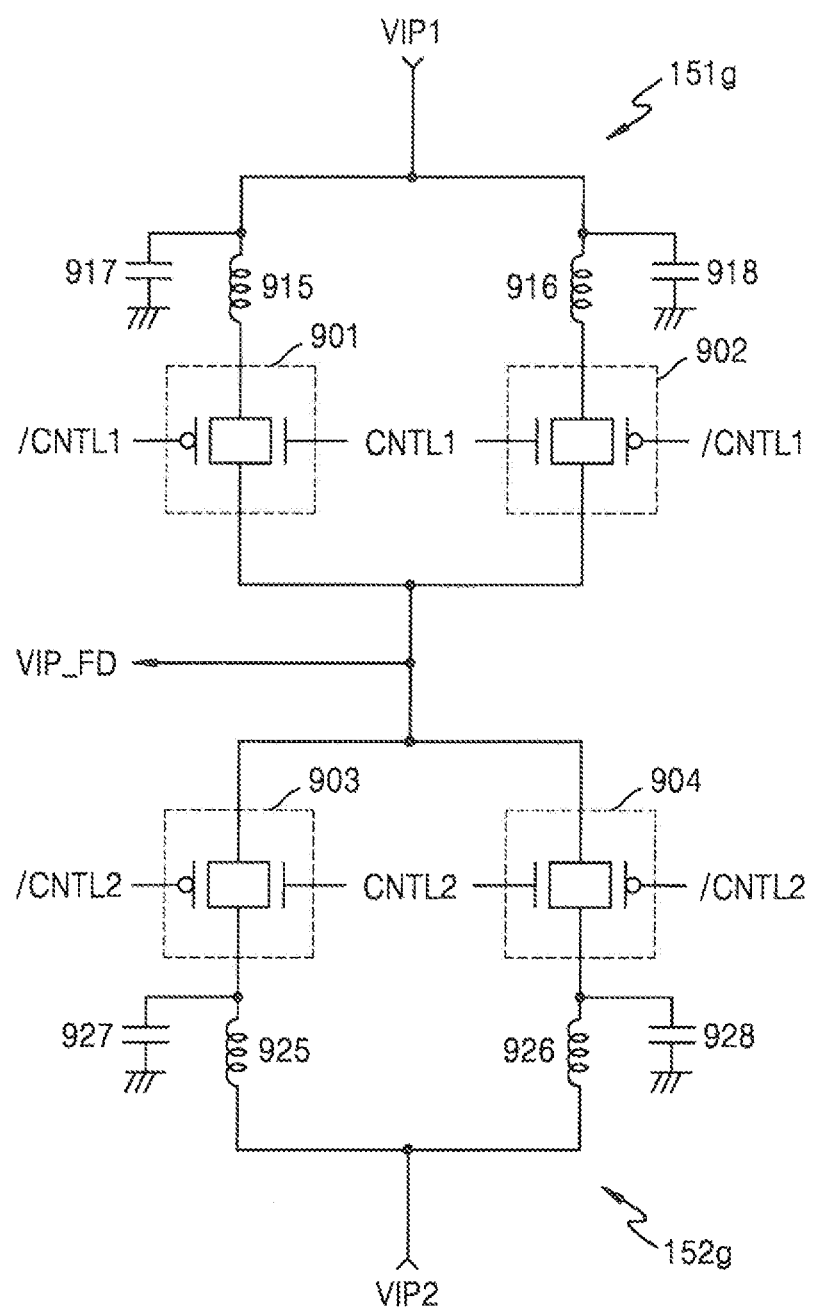

Referring to FIG. 9, in comparison with the first switch 151f of FIG. 8, a first switch 151g has a difference in that the first switch 151g includes a first inductor 915 instead of the first resistor 815 and includes a second inductor 916 instead of the second resistor 816. In comparison with the second switch 152f of FIG. 8, a second switch 152g has a difference in that the second switch 152g includes a third inductor 925 instead of the third resistor 825 and includes a fourth inductor 926 instead of the fourth resistor 826.

The first and second inductors 915 and 916 and first and second capacitors 917 and 918 may be provided by modeling a line network on a path through which the first internal voltage VIP1 is transmitted in a first circuit (120 of FIG. 2). The third and fourth inductors 925 and 926 and third and fourth capacitors 927 and 928 may be provided by modeling a line network on a path through which the second internal voltage VIP2 is transmitted in a second circuit (130 of FIG. 2).

In FIG. 9, the first switch 151g may vary a transmission of the first internal voltage VIP1 to the feedback internal voltage VIP_FD node according to a voltage level of the first control signal CNTL1, inductance values of the first and second inductors 915 and 916, and capacitance values of the first and second capacitors 917 and 918. The second switch 152g may vary a transmission of the second internal voltage VIP2 to the feedback internal voltage VIP_FD node according to a voltage level of the second control signal CNTL2, inductance values of the third and fourth inductors 825 and 826, and capacitance values of the third and fourth capacitors 927 and 928. The feedback internal voltage VIP_FD may be supplied to the voltage generation circuit 140 of the voltage generator 110 (see FIG. 2).

Figure 10:
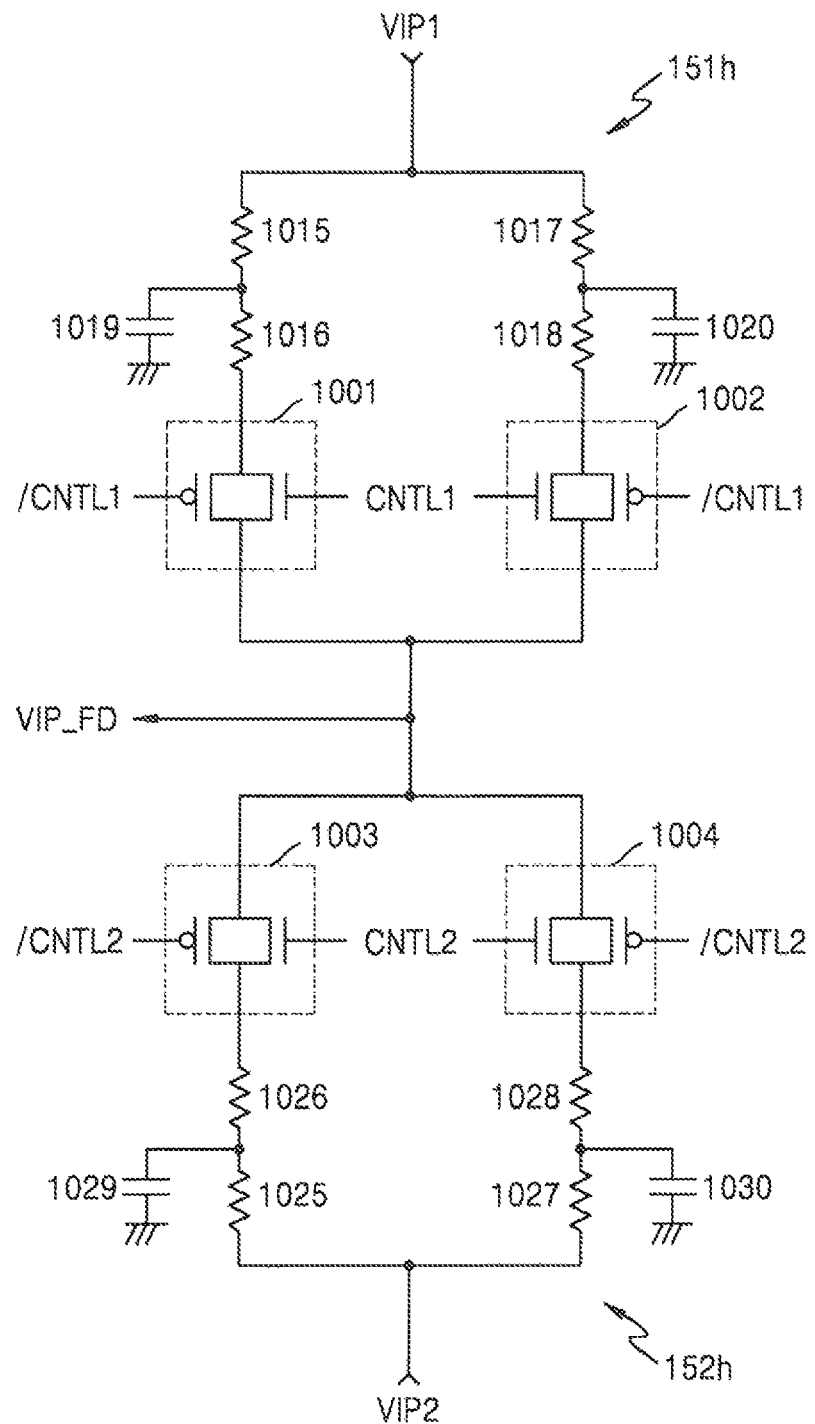

Referring to FIG. 10, a first switch 151h may include first and second resistors 1015 and 1016 serially connected to the first internal voltage VIP1, a first capacitor 1019 connected between a first end of the second resistor 1016 and the ground voltage VSS, a first transmission gate 1001 connected between a second end of the second resistor 1016 and the feedback internal voltage VIP_FD, third and fourth resistors 1017 and 1018 serially connected to the first internal voltage VIP1, a second capacitor 1020 connected between a first end of the fourth resistor 1018 and the ground voltage VSS, and a second transmission gate 1002 connected between a second end of the fourth resistor 1018 and the feedback internal voltage VIP_FD.

A second switch 152h may include fifth and sixth resistors 1025 and 1026 serially connected to the second internal voltage VIP2, a third capacitor 1029 connected between a first end of the sixth resistor 1026 and the ground voltage VSS, a third transmission gate 1003 connected between a second end of the sixth resistor 1026 and the feedback internal voltage VIP_FD, seventh and eighth resistors 1027 and 1028 serially connected to the second internal voltage VIP2, a fourth capacitor 1030 connected between a first end of the eighth resistor 1028 and the ground voltage VSS, and a fourth transmission gate 1004 connected between a second end of the eighth resistor 1028 and the feedback internal voltage VIP_FD.

The first to fourth resistors 1015 to 1018 and the first and second capacitors 1019 and 1020 may be provided by modeling a line network on a path through which the first internal voltage VIP1 is transmitted in a first circuit (120 of FIG. 2). The fifth to eighth resistors 1025 to 1028 and the third and fourth capacitors 1029 and 1030 may be provided by modeling a line network on a path through which the second internal voltage VIP2 is transmitted in a second circuit (130 of FIG. 2).

In FIG. 10, the first switch 151h may vary a transmission of the first internal voltage VIP1 to the feedback internal voltage VIP_FD node according to a voltage level of the first control signal CNTL1, resistance values of the first to fourth resistors 1015 to 1018, and capacitance values of the first and second capacitors 1019 and 1020. The second switch 152h may vary a transmission of the second internal voltage VIP2 to the feedback internal voltage VIP_FD node according to a voltage level of the second control signal CNTL2, resistance values of the fifth to eighth resistors 1025 to 1028, and capacitance values of the third and fourth capacitors 1029 and 1030. The feedback internal voltage VIP_FD may be supplied to the voltage generation circuit 140 of the voltage generator 110 (see FIG. 2).

Figure 11:
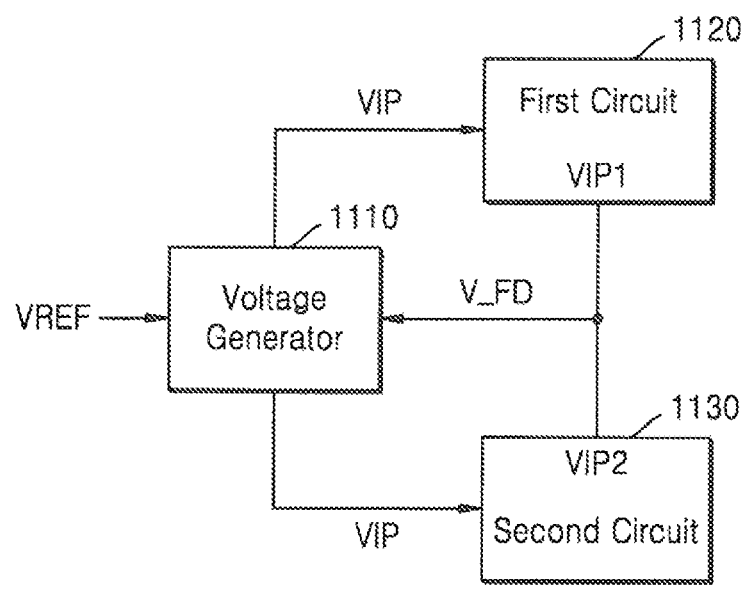
FIGS. 11 and 12 are diagrams illustrating a voltage generator including no feedback control circuit, in a comparative example.
Figure 12:
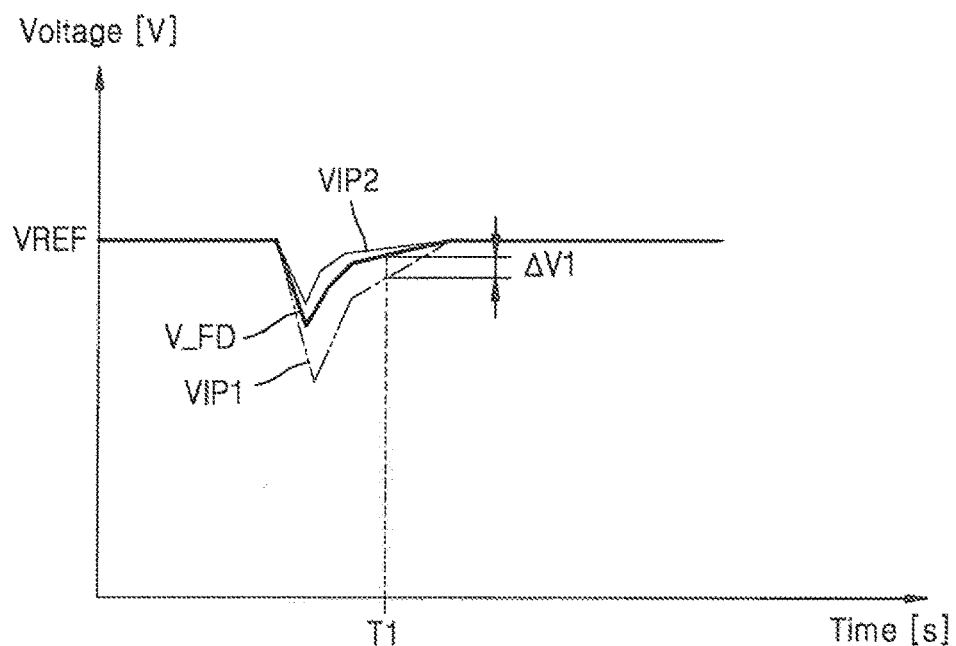

FIGS. 11 and 12 are diagrams illustrating a voltage generator 1110 without a feedback control circuit according to embodiments of the inventive concept to provide a comparative example.

Referring to FIG. 11, the voltage generator 1110 may compare a feedback internal voltage V_FD with a reference voltage VREF to generate an internal voltage VIP and may supply the generated internal voltage VIP to a first circuit 1120 and a second circuit 1130. The first circuit 1120 and the second circuit 1130 may be driven with the internal voltage VIP, and the internal voltage VIP may be consumed according to an operation mode. For example, it is assumed that the first circuit 1120 performs a refresh operation mode and the second circuit 1130 is in a standby mode. As the internal voltage VIP is consumed according to the refresh operation of the first circuit 1120, an internal voltage VIP1 of the first circuit 1120 may be large in variation as shown in FIG. 12. An internal voltage VIP2 of the second circuit 1130 in the standby mode may be small in variation as shown in FIG. 12.

The internal voltage VIP1 of the first circuit 1120 and the internal voltage VIP2 of the second circuit 1130 may be connected to each other in common and thus may be supplied as the feedback internal voltage V_FD to the voltage generator 1110. The feedback internal voltage V_FD, as shown in FIG. 12, may be supplied to the voltage generator 1110 at a voltage level which is a sum (i.e., an intermediate value) of a level of the internal voltage VIP1 of the first circuit 1120 and a level of the internal voltage VIP2 of the second circuit 1130.

At a time T1 of FIG. 12, the voltage generator 1110 may compare the feedback internal voltage V_FD with the reference voltage VREF to generate the internal voltage VIP. In this case, the feedback internal voltage V_FD may have a voltage level higher than the internal voltage VIP1 of the first circuit 1120 which is large in variation. The voltage generator 1110 may reflect the internal voltage VIP1 of the first circuit 1120 which is large in variation, thereby generating the internal voltage VIP. However, the voltage generator 1110 generates the internal voltage VIP with no consideration of a large voltage difference ΔV1 between the internal voltage VIP1 of the first circuit 1120 and the feedback internal voltage V_FD.

Figure 13:
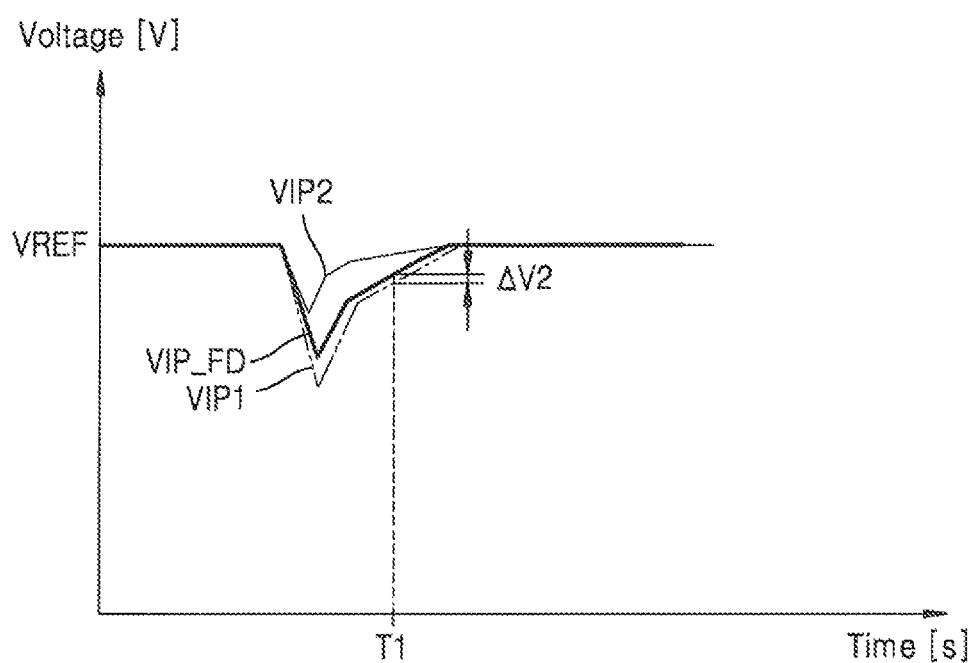
FIG. 13 is a diagram illustrating an operation of a voltage generator including a feedback control circuit according to some embodiments.

FIG. 13 is a diagram illustrating an operation of a voltage generator including a feedback control circuit according to some embodiments of the inventive concept.

Referring to FIG. 13, as described above with reference to FIG. 2, a relatively large variation of the first internal voltage VIP1 of the first circuit 120 in the refresh operation mode is shown, and a smaller variation of the second internal voltage VIP2 of the second circuit 130 in the standby mode is shown. The voltage generator 110 may receive the first internal voltage VIP1 of the first circuit 120, to which a high transmission weighting is applied, through the first switch 151 of the feedback control circuit 150 and may receive through the second switch 152 the second internal voltage VIP2 of the second circuit 130 to which a low transmission weighting is applied, thereby generating the internal voltage VIP.

The feedback internal voltage VIP_FD has a waveform similar to a waveform of the first internal voltage VIP1 because the first internal voltage VIP1, where a transmission weighing is set high and a variation is large, is largely reflected. At a time T1, a voltage difference ΔV2 between the internal voltage VIP1 of the first circuit 120 and the feedback internal voltage VIP_FD is relatively small to negligible. The voltage generation circuit 140 may compare the reference voltage VREF with the feedback internal voltage VIP_FD similar to the first internal voltage VIP1 which is large in variation, thereby generating the internal voltage VIP. Therefore, the voltage generator 110 may stably generate the internal voltage VIP, based on the feedback internal voltage VIP_FD associated with the first internal voltage VIP1 which is large in variation.

Figure 14:
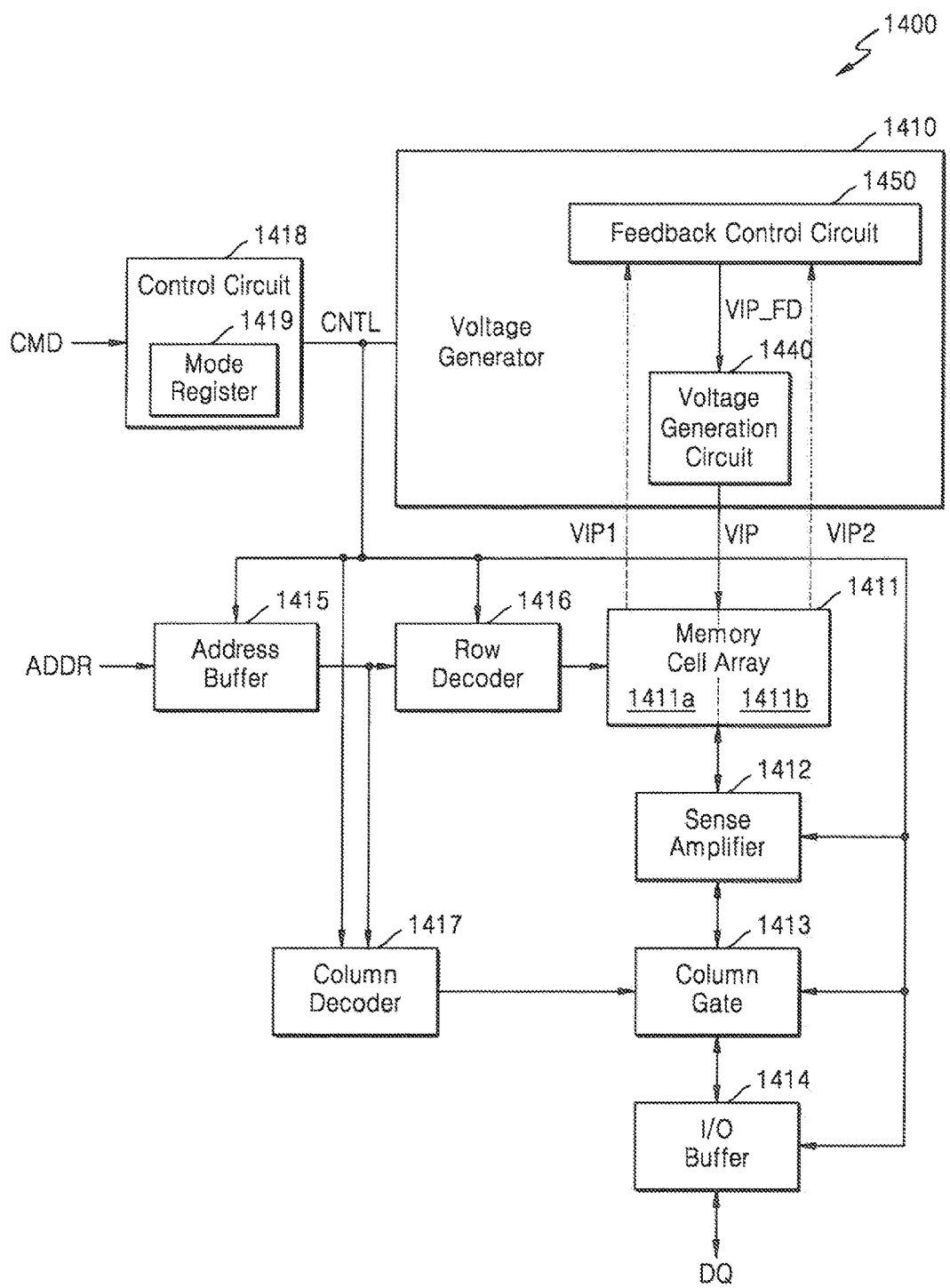
FIG. 14 is a block diagram exemplarily illustrating a memory device to which a voltage generator including a feedback control circuit according to some embodiments is applied.

FIG. 14 is a block diagram illustrating a memory device 1400 to which a voltage generator including a feedback control circuit according to some embodiments is applied.

Referring to FIG. 14, the memory device 1400 may include a voltage generator 1410, a memory cell array 1411, a sense amplifier 1412, a column gate 1413, an input/output (I/O) buffer 1414, an address buffer 1415, a row decoder 1416, a column decoder 1417, and a control circuit 1418.

The voltage generator 1410 may generate an internal voltage VIP of the memory device 1400. The internal voltage VIP may be at least one of a high voltage VPP for driving a word line, an internal supply voltage VINT, a bit line equalizing voltage VEQ, a bit line pre-charge voltage VBL, a memory cell plate voltage VP, and a substrate supply voltage VBB.

The memory cell array 1411 may be configured with a plurality of memory cells (e.g., DRAM cells) which each include one access transistor and one storage capacitor. The memory cells may be arranged in a matrix structure of rows and columns. The memory cell array 1411 may include a first memory cell block 1411a and a second memory cell block 1411b. The first memory cell block 1411a and the second memory cell block 1411b may operate independently from each other.

The first memory cell block 1411a and the second memory cell block 1411b may be driven with the internal voltage VIP supplied from the voltage generator 1410. In the first memory cell block 1411a, the internal voltage VIP which is consumed may vary according to an operation mode of the first memory cell block 1411a and thus may be output as a first internal voltage VIP1 through a first power line network. In the second memory cell block 1411b, the internal voltage VIP which is consumed may vary according to an operation mode of the second memory cell block 1411b and thus may be output as a second internal voltage VIP2 through a second power line network.

The first internal voltage VIP1 of the first memory cell block 1411a and the second internal voltage VIP2 of the second memory cell block 1411b may be supplied to a feedback control circuit 1450 of the voltage generator 1410. The feedback control circuit 1450 may transmit the first and second internal voltages VIP1 and VIP2, to which varied transmission rates are respectively applied, as the feedback internal voltage VIP_FD in response to control signals CNTL supplied from the control circuit 1418. The feedback internal voltage VIP_FD may be generated based on the first and second internal voltages VIP1 and VIP2 which are large in variation. A voltage generation circuit 1440 of the voltage generator 1410 may stably generate the internal voltage VIP, based on the feedback internal voltage VIP_FD.

The control circuit 1418 may receive a command CMD and an address ADDR applied to the memory device 1400 to generate the control signals CNTL for controlling predetermined operation modes. The control signals CNTL may be supplied from a mode register 1419.

The address buffer 1415 may receive and buffer the address ADDR applied to the memory device 1400. In response to the control signals CNTL, the address buffer 1415 may supply a row address for selecting a row of the memory cell array 1411 to the row decoder 1416 and may supply a column address for selecting a column of the memory cell array 1411 to the column decoder 1417.

The row decoder 1416 may decode a row address in response to the control signals CNTL. The decoded row address may be supplied to the memory cell array 1411 to drive a word line selected from among a plurality of word lines connected to the memory cells. Data stored in each of memory cells connected to the selected word line may be sensed and amplified by the sense amplifier 1412.

The column decoder 1417 may decode a column address in response to the control signals CNTL. The column gate 1413 may perform column gating according to the decoded column address to select at least one bit line from among bit lines connected to the memory cells.

The I/O buffer 1414 may buffer data input/output to/from the memory device 1400 in response to the control signals CNTL. In a read operation, the I/O buffer 1414 may buffer data read from the memory cell array 1411 and may output the buffered data to a data I/O terminal DQ. In a write operation, the I/O buffer 1414 may buffer data received through the data I/O terminal DQ and may supply the buffered data to the memory cell array 1411.

Figure 15:
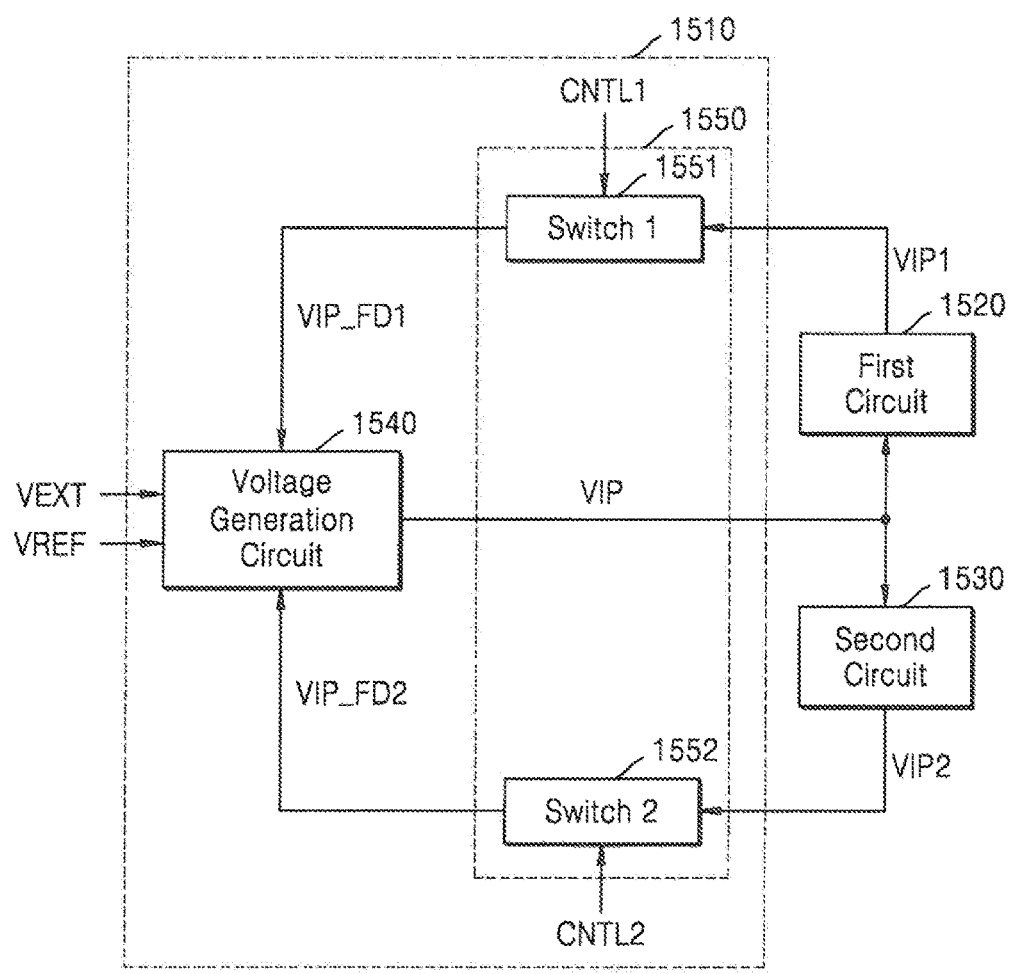
FIG. 15 is a block diagram illustrating a voltage generator including a feedback control circuit according to another embodiment.

FIG. 15 is a block diagram illustrating a voltage generator 1510 including a feedback control circuit according to another embodiment.

Referring to FIG. 15, the voltage generator 1510 may include a voltage generation circuit 1540 and a feedback control circuit 1550. In comparison with the voltage generator 110 of FIG. 2, the voltage generator 1510 has a difference in that a first internal voltage VIP1 of a first circuit 1520 is supplied as a first feedback internal voltage VIP_FD1 to the voltage generation circuit 1540 through a first switch 1551, and a second internal voltage VIP2 of a second circuit 1530 is supplied as a second feedback internal voltage VIP_FD2 to the voltage generation circuit 1540 through a second switch 1552. That is, the first internal voltage VIP1 of the first circuit 1520 and the second internal voltage VIP2 of the second circuit 1530 may be separately supplied to the voltage generation circuit 1540.

The first and second switches 1551 and 1552 may be respectively configured identically to the switches described above with reference to FIGS. 4 to 10. However, the first internal voltage VIP1 of the first circuit 1520 may be transmitted as the first feedback internal voltage VIP_FD1 through the first switch 1551, and the second internal voltage VIP2 of the second circuit 1530 may be transmitted as the second feedback internal voltage VIP_FD2 through the second switch 1552.

The voltage generation circuit 1540 may receive the first and second feedback internal voltages VIP_FD1 and VIP_FD2 and may compare each of the first and second feedback internal voltages VIP_FD1 and VIP_FD2 with a reference voltage VREF to generate an internal voltage VIP. Therefore, the voltage generator 1510 may stably generate the internal voltage VIP, based on the first and second feedback internal voltages VIP_FD1 and VIP_FD2.

Figure 16:
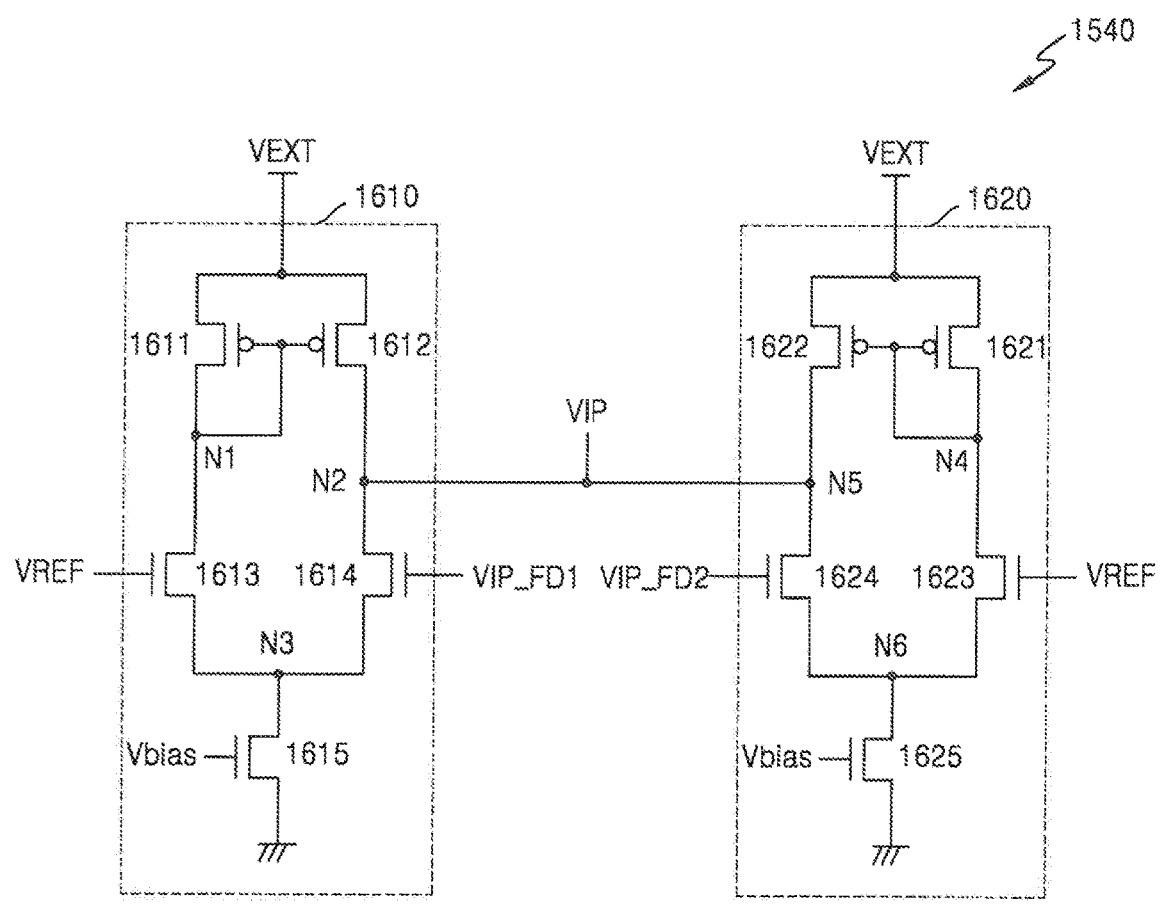
FIG. 16 is a circuit diagram illustrating a voltage generation circuit of FIG. 15.

FIG. 16 is a circuit diagram illustrating the voltage generation circuit 1540 of FIG. 15.

Referring to FIG. 16, the voltage generation circuit 1540 may include a first voltage generation circuit 1610 and a second voltage generation circuit 1620. The first voltage generation circuit 1610 may compare the first feedback internal voltage VIP_FD1 with the reference voltage VREF and the second voltage generation circuit 1620 may compare the second feedback internal voltage VIP_FD2 with the reference voltage VREF to generate the internal voltage VIP.

The first and second voltage generation circuits 1610 and 1620 may each be configured identically to the voltage generation circuit 140 described above with reference to FIG. 3. The first voltage generation circuit 1610 may include a first PMOS transistor 1611 connected between an external supply voltage VEXT and a first node N1, a second PMOS transistor 1612 connected between the external supply voltage VEXT and a second node N2, a first NMOS transistor 1613 connected between the first node N1 and a third node N3, a second NMOS transistor 1614 connected between the second node N2 and the third node N3, and a third NMOS transistor 1615 connected between the third node N3 and a ground voltage VSS. The second voltage generation circuit 1620 may include a third PMOS transistor 1621 connected between the external supply voltage VEXT and a fourth node N4, a fourth PMOS transistor 1622 connected between the external supply voltage VEXT and a fifth node N5, a fourth NMOS transistor 1623 connected between the fourth node N4 and a sixth node N6, a fifth NMOS transistor 1624 connected between the fifth node N5 and the sixth node N6, and a sixth NMOS transistor 1625 connected between the sixth node N6 and the ground voltage VSS.

Gates of the first and second PMOS transistors 1611 and 1612 may be connected to the first node N1, a gate of the first NMOS transistor 1613 may be connected to the reference voltage VREF, and a gate of the second NMOS transistor 1614 may be connected to the first feedback internal voltage VIP_FD1. Gates of the third and fourth PMOS transistors 1621 and 1622 may be connected to the fourth node N4, a gate of the fourth NMOS transistor 1623 may be connected to the reference voltage VREF, and a gate of the fifth NMOS transistor 1624 may be connected to the second feedback internal voltage VIP_FD2. A bias voltage Vbias may be applied to gates of the third and sixth NMOS transistor 1615 and 1625. The second node N2 and the fifth node N5 may be connected to each other to output the internal voltage VIP.

The voltage generation circuit 1540 may compare the first feedback internal voltage VIP_FD1 with the reference voltage VREF and may compare the second feedback internal voltage VIP_FD2 with the reference voltage VREF to generate the internal voltage VIP. The voltage generation circuit 1540 may generate the internal voltage VIP as a sum of results obtained by respectively comparing the first feedback internal voltage VIP_FD1 and the second feedback internal voltage VIP_FD2 with the reference voltage VREF.

Figure 17:
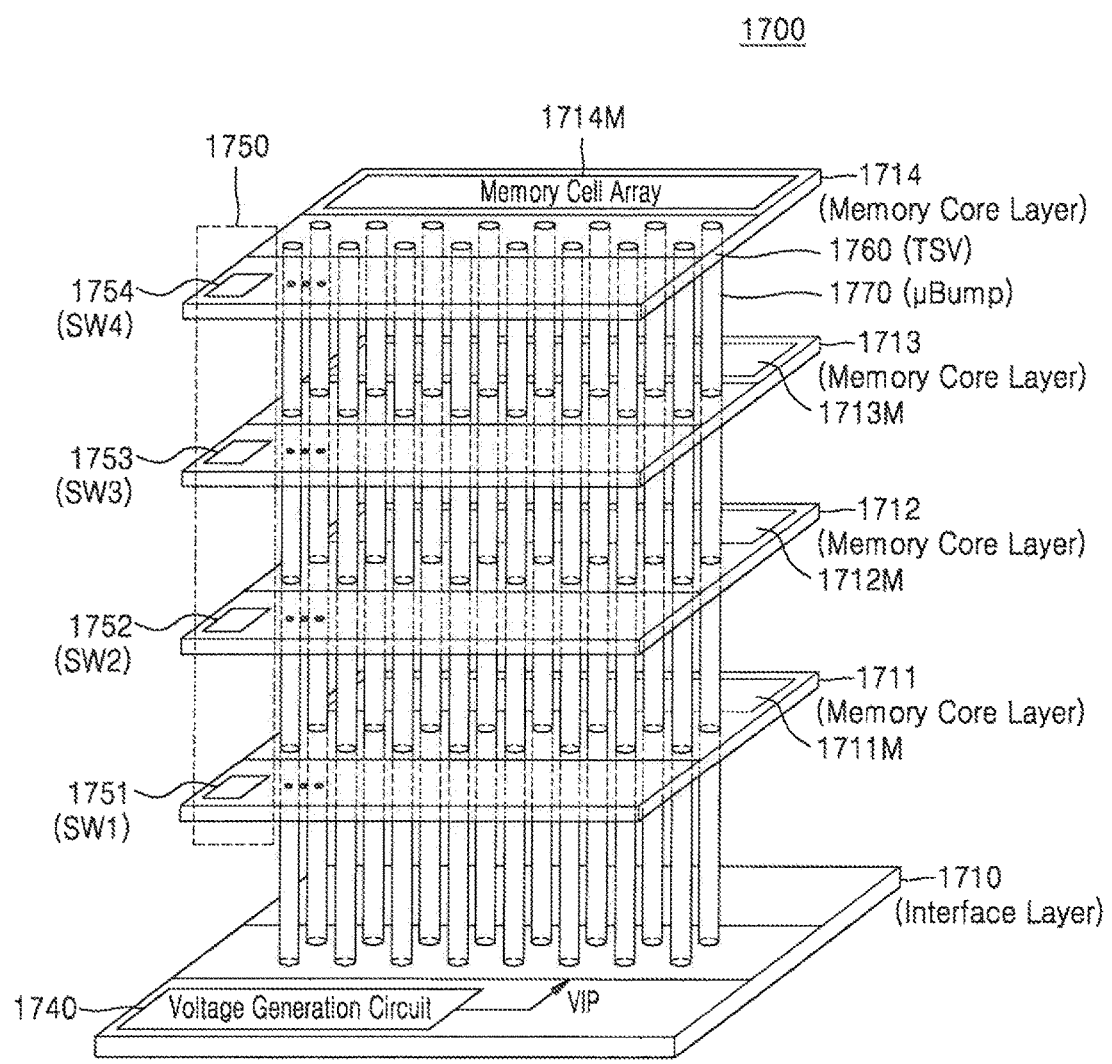
FIG. 17 is a diagram illustrating an application example where a voltage generator according to embodiments is applied to a memory device stacked through a plurality of through electrodes.

FIG. 17 is a diagram illustrating an application example where a voltage generator according to embodiments is applied to a memory device 1700 stacked through a plurality of through electrodes.

Referring to FIG. 17, the memory device 1700 may include an interface layer 1710 disposed under a plurality of memory core layers 1711 to 1714 which are stacked. The memory device 1700 may include a voltage generator which includes a voltage generation circuit 1740 disposed in the interface layer 1710 and a feedback control circuit distributed to each of the memory core layers 1711 to 1714.

The memory core layers 1711 to 1714 may respectively include memory cell array blocks 1711M to 1714M and switches 1751 to 1754 connected to an internal voltage of a corresponding memory core layer. The switches 1751 to 1754 of the respective memory core layers 1711 to 1714 may configure a feedback control circuit 1750 that applies a variable transmission rate to a varied internal voltage of a corresponding memory core layer.

The memory core layers 1711 to 1714 may be connected to the interface layer 1710 through micro bumps 1770 between through silicon vias 1760 of a corresponding memory core layer and the memory core layers 1711 to 1714. The feedback control circuit 1750 may be connected to the voltage generation circuit 1740 of the interface layer 1710 through the through silicon vias 1760 and the micro bumps 1770.

The voltage generation circuit 1740 may reflect a varied internal voltage of a corresponding memory core layer transmitted through the feedback control circuit 1750 to stably generate the internal voltage VIP.

Figure 18:
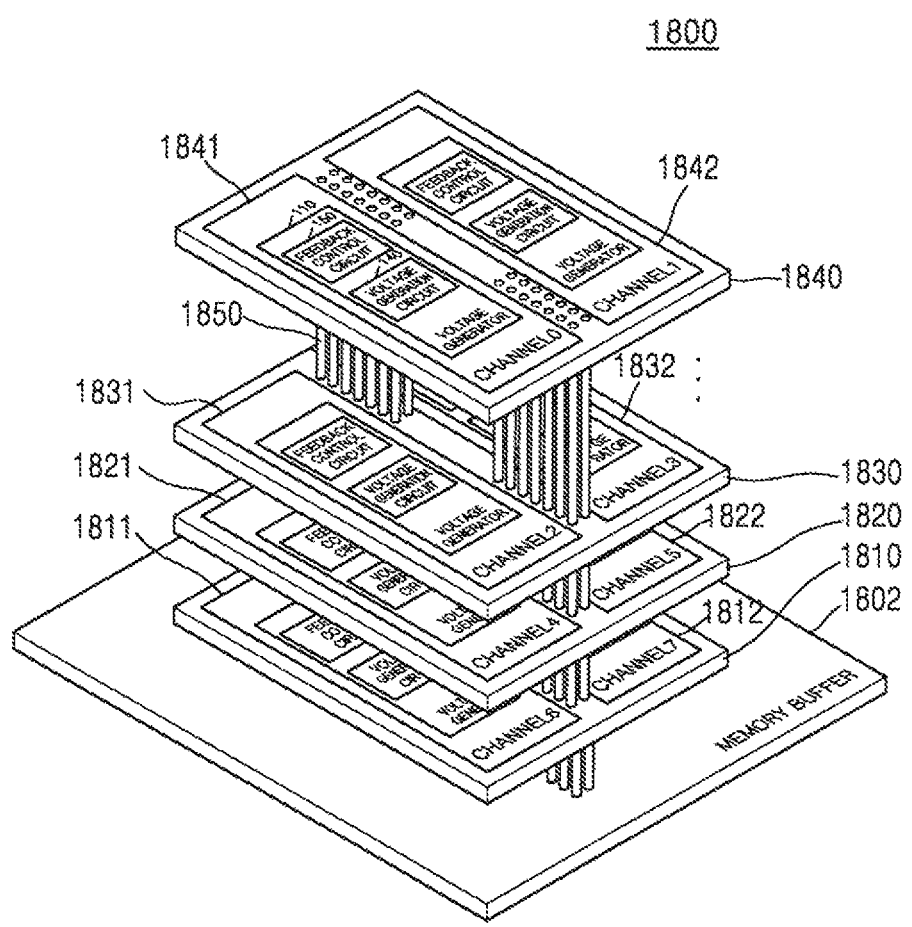
FIG. 18 is a diagram illustrating a multichip package including a voltage generator according to embodiments.

FIG. 18 is a diagram illustrating a multichip package 1800 including a voltage generator according to embodiments. The multichip package 1800 may be a semiconductor package which is implemented as one package by stacking a plurality of semiconductor chips or various kinds of semiconductor chips.

Referring to FIG. 18, the multichip package 1800 may include a memory buffer 1802 disposed under a plurality of memory layers 1810, 1820, 1830 and 1840 which are stacked. The memory layers 1810, 1820, 1830 and 1840 may configure a plurality of independent interfaces referred to as channels. The memory layers 1810, 1820, 1830 and 1840 may be respectively configured with two channels 1811 and 1812, two channels 1821 and 1822, two channels 1831 and 1832, and two channels 1841 and 1842. Each of the channels 1811, 1812, 1821, 1822, 1831, 1832, 1841 and 1842 may include a plurality of independent memory banks and may be independently clocked.

In the present embodiment, an example where the semiconductor device 1800 is configured with eight channels by stacking four memory layers 1810, 1820, 1830 and 1840 is provided. In other embodiments, two to eight memory layers may be stacked in the semiconductor device 1800. In some embodiments, each of the memory layers 1810, 1820, 1830 and 1840 may be configured with one or four channels. In some embodiments, a single channel may be distributed to the plurality of memory layers 1810, 1820, 1830 and 1840.

The memory buffer 1802 may provide a signal distribution function of receiving a command, an address, a clock, and data from an external controller and supplying the received command, address, clock, and data to the memory layers 1810, 1820, 1830 and 1840. The memory buffer 1802 may buffer all of the command, the address, the clock, and the data, and thus, a memory controller may drive only a load of the memory buffer 1802, thereby interfacing the memory layers 1810, 1820, 1830 and 1840.

The memory buffer 1802 and the memory layers 1810, 1820, 1830 and 1840 may transmit or receive a signal therebetween through a plurality of through silicon vias (TSVs) and the micro bumps 1850. The memory buffer 1802 may communicate with a conductive means provided on an outer surface of the semiconductor device 1800, and for example, may communicate with an external memory controller through solder balls.

The channels 1811, 1812, 1821, 1822, 1831, 1832, 1841 and 1842 of the memory layers 1810, 1820, 1830 and 1840 may include the voltage generator 110. Each of the channels 1811, 1812, 1821, 1822, 1831, 1832, 1841 and 1842 may generate an internal voltage by using the voltage generator 110. The voltage generator 110 may apply through the feedback control circuit 150 a variable transmission rate to the internal voltage which varies according to an operation of a corresponding channel being activated and may transmit the varied internal voltage to the voltage generation circuit 140, and the voltage generation circuit 140 may reflect the varied internal voltage transmitted through the feedback control circuit 150 to stably generate the internal voltage.

Figure 19:
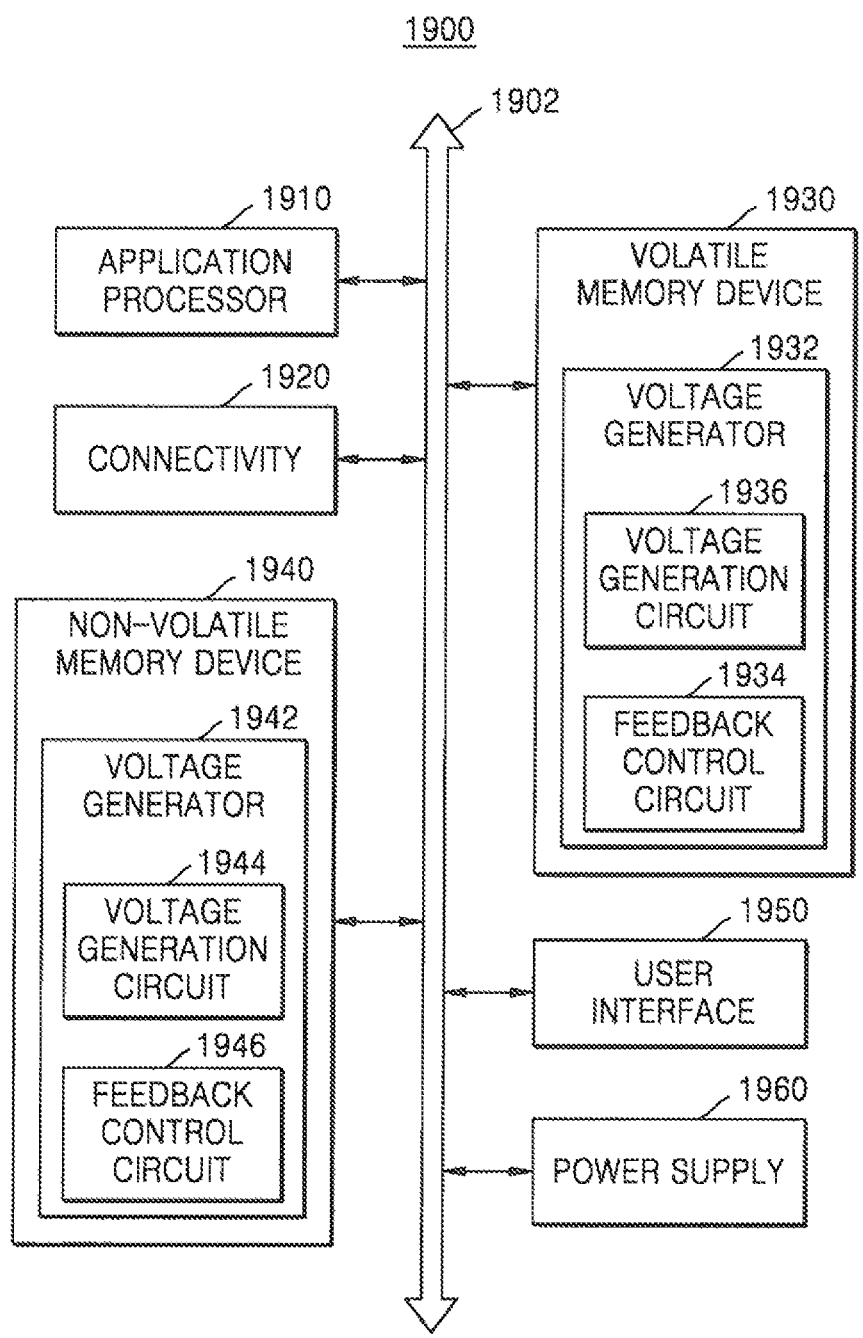
FIG. 19 is a block diagram illustrating an application example where a memory device including a voltage generator according to embodiments is applied to a mobile system.

FIG. 19 is a block diagram illustrating an application example where a memory device including a voltage generator according to embodiments is applied to a mobile system 1900.

Referring to FIG. 19, the mobile system 1900 may include an application processor 1910, a connectivity unit 1920, a first memory device 1930, a second memory device 1940, a user interface 1950, and a power supply 1960 which are connected to each other through a bus 102. The first memory device 1930 may be implemented with a volatile memory device, and the second memory device 1940 may be implemented as a nonvolatile memory device.

According to some embodiments, the mobile system 1900 may be an arbitrary mobile system such as a mobile phone, a smartphone, a personal digital assistant (PDA), a portable multimedia player (PMP), a digital camera, a music player, a portable game console, a navigation system, or the like.

The application processor 1910 may execute applications for providing Internet browsers, gams, videos, and/or the like. According to some embodiments, the application processor 1910 may include one processor core or a plurality of processor cores. For example, the application processor 1910 may include a dual-core, a quid-core, and a hexa-core. Also, according to some embodiments, the application processor 1910 may further include a cache memory disposed inside or outside the application processor 1910.

The connectivity unit 1920 may perform wired or wireless communication with an external device. For example, the connectivity unit 1920 may perform Ethernet communication, near field communication (NFC), radio frequency identification (RFID) communication, mobile telecommunication, memory card communication, universal serial bus (USB) communication, and/or the like. For example, the connectivity unit 1920 may include a baseband chipset and may support communication such as GSM, GPRS, WCDMA, HSxPA, and/or the like.

The first memory device 1930 that is a nonvolatile memory device may store, as write data, data obtained through processing by the application processor 1910 or may operate as a working memory. The first memory device 1930 may generate an internal voltage by using a first voltage generator 1932. The first memory device 1930 may apply through a feedback control circuit 1934 a variable transmission rate to the internal voltage which varies according to an operation of the first memory device 1930 being activated and may transmit the varied internal voltage to a voltage generation circuit 1936, and the voltage generation circuit 1936 may reflect the varied internal voltage transmitted through the feedback control circuit 1934 to stably generate the internal voltage.

The second memory device 1940 that is a nonvolatile memory device may store a boot image for booting the mobile system 1900. For example, the nonvolatile memory device 1940 may be implemented with electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or a memory similar thereto.

The second memory device 1940 may generate an internal voltage by using a second voltage generator 1942. The second memory device 1940 may apply through a feedback control circuit 1944 the variable transmission rate to the internal voltage which varies according to an operation of the second memory device 1940 being activated and may transmit the varied internal voltage to a voltage generation circuit 1946, and the voltage generation circuit 1946 may reflect the varied internal voltage transmitted through the feedback control circuit 1944 to stably generate the internal voltage.

The user interface 1950 may include one or more input devices, such as a keypad, a touch screen, etc., or one or more output devices such as a speaker, a display device, etc. The user interface 1950 may supply an operation voltage of the power supply 1960. Also, according to some embodiments, the mobile system 1900 may further include a camera image processor (CIP) and may further include a storage device such as a memory card, a solid state drive (SSD), a hard disk drive (HDD), a CD-ROM, or the like.

Figure 20:
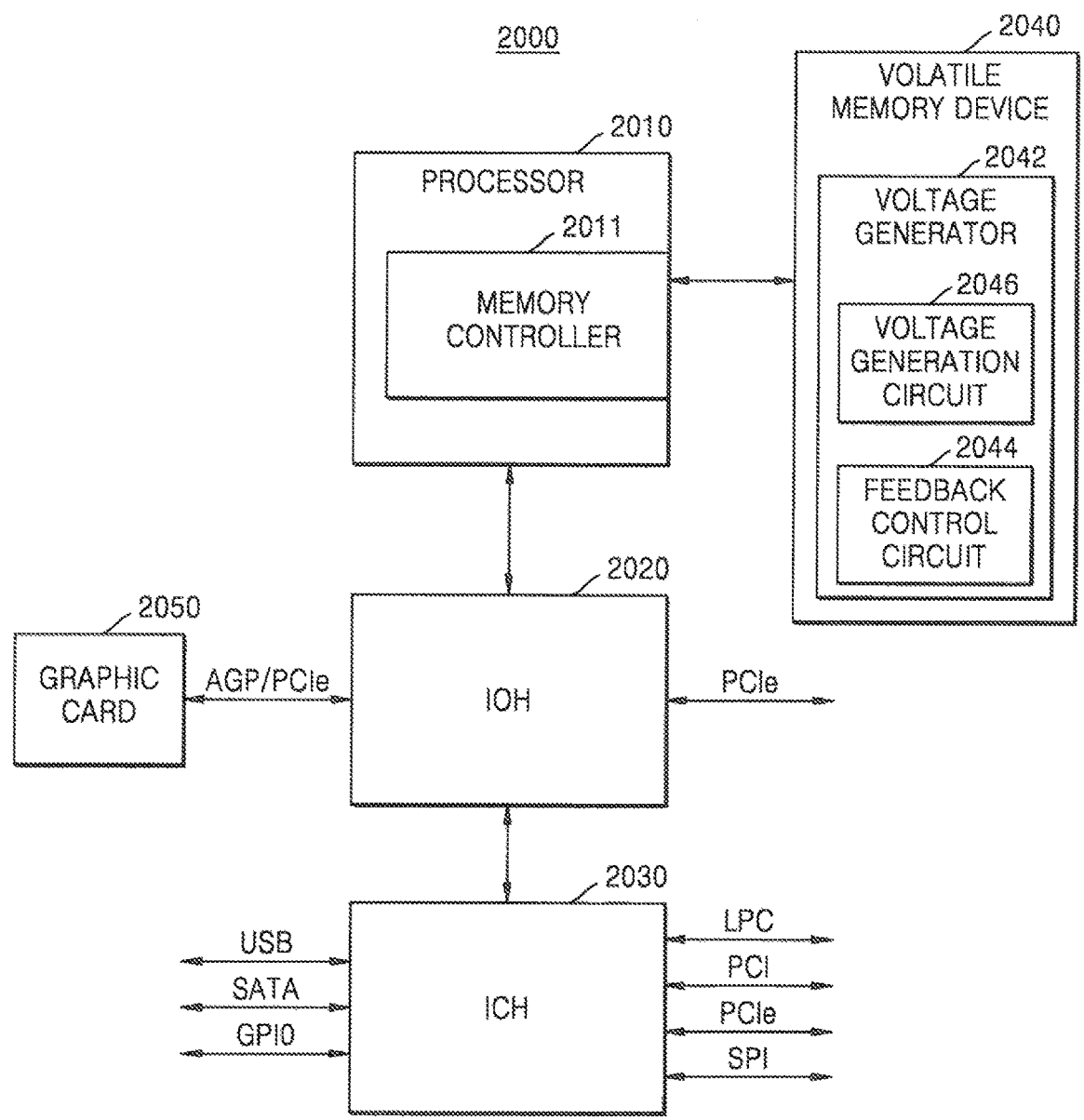
FIG. 20 is a block diagram illustrating an application example where a memory device including a voltage generator according to embodiments is applied to a computing system.

FIG. 20 is a block diagram illustrating an application example where a memory device including a voltage generator according to embodiments is applied to a computing system 2000.

Referring to FIG. 20, the computing system 2000 may include a processor 2010, an input/output hub 2020, an input/output controller hub 2030, a memory device 2040, and a graphic card 2050. According to some embodiments, the computing system 2000 may be an arbitrary computing system such as a personal computer (PC), a server computer, a workstation, a laptop computer, a mobile phone, a smartphone, a PDA, a PMP, a digital camera, a digital television (TV), a set-top box, a music player, a portable game console, a navigation system, or the like.

The processor 2010 may execute various computing functions such as certain calculations or tasks. For example, the processor 2010 may be a microprocessor or a central processing unit (CPU). According to some embodiments, the processor 2010 may include one processor core or a plurality of processor cores. For example, the processor 2010 may include a dual-core, a quad-core, a hexa-core, and/or the like. Also, the computing system 2000 including one the processor 2010 is illustrated in FIG. 20. In other embodiments, the computing system 2000 may include a plurality of processors. Also, according to other embodiments, the processor 2010 may further include a cache memory disposed inside or outside the processor 2010.

The processor 2010 may include a memory controller 2011 that controls an operation of the memory device 2040. The memory controller 2011 included in the processor 2010 may be referred to as an integrated memory controller (IMC). According to some embodiments, the memory controller 2011 may be disposed in the input/output hub 2020. The input/output hub 2020 including the memory controller 2011 may be referred to as a memory controller hub (MCH).

The memory device 2040 may generate an internal voltage by using a voltage generator 2042. The memory device 2040 may apply through a feedback control circuit 2044 a variable transmission rate to the internal voltage which varies according to an operation of the memory device 2040 being activated and may transmit the varied internal voltage to a voltage generation circuit 2046, and the voltage generation circuit 2046 may reflect the varied internal voltage transmitted through the feedback control circuit 2044 to stably generate the internal voltage.

The input/output hub 2020 may manage data transmission between the processor 2010 and devices such as the graphic card 2050 and/or the like. The input/output hub 2020 may be connected to the processor 2010 through various types of interfaces. For example, the input/output hub 2020 may be connected to the processor 2010 through various standard interfaces such as a front side bus (FSB), a system bus, hyper transport, lighting data transport (LDT), quick path interconnect (QPI), a common system interface, peripheral component interface-express (PCIe), and/or the like. In FIG. 20, the computing system 2000 including one the input/output hub 2020 is illustrated. However, in other embodiments, the computing system 2000 may include a plurality of input/output hubs.

The input/output hub 2020 may provide various interfaces with devices. For example, the input/output hub 2020 may provide an accelerated graphics port (AGP) interface, PCIe, a communications streaming architecture (CSA) interface, and/or the like.

The graphic card 2050 may be connected to the input/output hub 2020 through AGP or PCIe. The graphic card 2050 may control a display device (not shown) for displaying an image. The graphic card 2050 may include an internal memory device and an internal processor for processing image data. According to some embodiments, the input/output hub 2020 may include a graphic device disposed inside the input/output hub 2020 along with the graphic card 2050 disposed outside the input/output hub 2020 or instead of the graphic card 2050. The graphic device included in the input/output hub 2020 may be referred to as integrated graphics. Also, the input/output hub 2020 including a memory controller and the graphic device may be referred to as a graphics and memory controller hub (GMCH).

The input/output controller hub 2030 may control data buffering and interface in order for various system interfaces to efficiently operate. The input/output controller hub 2030 may be connected to the input/output hub 2020 through an internal bus. For example, the input/output hub 2020 may be connected to the input/output controller hub 2030 through a direct media interface (DMI), a hub interface, an enterprise south bridge interface (ESI), PCIe, and/or the like.

The input/output controller hub 2030 may provide various interfaces with peripheral devices. For example, the input/output controller hub 2030 may provide an USB port, a serial advanced technology attachment (SATA) port, a general-purpose input/output (GPIO), a low pin count (LPC) bus, a serial peripheral interface (SPI), PCI, PCIe, and/or the like.

According to some embodiments, two or more of the processor 2010, the input/output hub 2020, and the input/output controller hub 2030 may be implemented as one chipset.

While the inventive concept has been particularly shown and described with reference to embodiments thereof, it will be understood that various changes in form and details may be made therein without departing from the spirit and scope of the following claims.

What is claimed is:

1. A voltage generator which generates an internal voltage, comprising:
    a feedback control circuit that is configured to receive a plurality of varied internal voltages and to generate a plurality of feedback voltages, the feedback voltages comprising a combination of a weighting of respective ones of the plurality of varied internal voltages; and
    a voltage generation circuit configured to generate the internal voltage based on the plurality of feedback voltages, wherein the weighting of the respective ones of the plurality of varied internal voltages is based on a control signal, and wherein the voltage generation circuit performs a comparison, wherein each of the plurality of feedback voltages is individually compared with a reference voltage.

2. The voltage generator of claim 1, wherein the control signal is generated based on an operation mode of a circuit region to which the internal voltage is applied.

3. The voltage generator of claim 1, wherein the feedback control circuit comprises a switch configured to transmit the plurality of feedback voltages according to a voltage level of the control signal.

4. The voltage generator of claim 3, wherein the switch comprises components corresponding to a model of a path through which the varied internal voltages are received.

5. The voltage generator of claim 1, wherein the feedback control circuit comprises a switch configured to transmit the feedback voltages according to multiple bits of the control signal.

6. The voltage generator of claim 5, wherein the switch comprises components corresponding to a model of a path through which the plurality of varied internal voltages is received.

7. The voltage generator of claim 1, wherein the voltage generation circuit generates the internal voltage responsive to the comparison.

8. A memory device comprising:
    a voltage generator configured to generate an internal voltage;
    a first circuit driven by the voltage generator and configured to vary a first voltage derived from the internal voltage; and
    a second circuit driven by the voltage generator and configured to vary a second voltage derived from the internal voltage, wherein the voltage generator comprises:
    a feedback control circuit configured to generate a plurality of feedback voltages, the plurality of feedback voltages comprising a combination of a weighting of the first voltage and the second voltage; and
    a voltage generation circuit configured to generate the internal voltage responsive to the plurality of feedback voltages, wherein the weighting of the first voltage and the second voltage is based on first and second control signals, and wherein the voltage generation circuit performs a comparison, wherein each of the plurality of feedback voltages is separately compared with a reference voltage.

9. The memory device of claim 8, wherein the first and second control signals are generated based on operation modes of the first and second circuits.

10. The memory device of claim 8, wherein the first and second control signals are generated based on information stored in a mode register of the memory device.

11. The memory device of claim 8, wherein the feedback control circuit comprises:
    a first switch configured to transmit the first voltage in response to the first control signal; and
    a second switch configured to transmit the second voltage in response to the second control signal.

12. The memory device of claim 11, wherein the first and second switches each comprise components corresponding to a model of a path through which each of the first and second voltages is received.

13. The memory device of claim 8, wherein the feedback control circuit comprises:
    a first switch configured to transmit the first voltage to generate a first feedback voltage in response to the first control signal;
    a second switch configured to transmit the second voltage to generate a second feedback voltage in response to the second control signal.

14. The memory device of claim 8, comprising first and second memory cell blocks where a plurality of memory cells is arranged, wherein the first circuit is connected to the first memory cell block, and wherein the second circuit is connected to the second memory cell block.

15. The memory device of claim 8, comprising first and second stacked memory layers, wherein the first and second memory layers are connected to through silicon vias of a corresponding memory layer through a micro bump, wherein the first circuit corresponds to the first memory layer, and wherein the second circuit corresponds to the second memory layer.

16. A semiconductor device comprising:
    a voltage generator circuit configured to generate an internal voltage; and
    a feedback voltage generator circuit configured to receive first and second feedback voltages and to variably couple respective first and second nodes having the first and second feedback voltages thereat to respective voltage feedback nodes of the voltage generator circuit responsive to first and second control signals, wherein the feedback voltage generator circuit comprises respective first and second transmission gates configured to couple the first and second nodes to the respective voltage feedback nodes responsive to the first and second control signals, and wherein the voltage generator circuit comprises first and second voltage generator circuits having outputs coupled to one another and each configured to compare a respective one of the first and second feedback voltages on a respective voltage feedback node of the respective voltage feedback nodes to a voltage reference signal.

17. The semiconductor device of claim 16, wherein the first and second control signals are variable voltage signals or multi-bit digital signals.

18. The semiconductor device of claim 16, wherein the voltage generator circuit is configured to compare a voltage at each respective voltage feedback node to a reference voltage to generate the internal voltage.

* * * * *